US012640838B2

(12) United States Patent
Tan et al.

(10) Patent No.: US 12,640,838 B2
(45) Date of Patent: May 26, 2026

(54) DATA SENDING METHOD, DATA RECEIVING METHOD, AND COMMUNICATION APPARATUS

(71) Applicant: HUAWEI TECHNOLOGIES CO., LTD., Shenzhen (CN)

(72) Inventors: Zhiyuan Tan, Shanghai (CN); Pengpeng Dong, Shanghai (CN); Huiying Zhu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 336 days.

(21) Appl. No.: 18/397,087

(22) Filed: Dec. 27, 2023

(65) Prior Publication Data

US 2024/0137149 A1 Apr. 25, 2024

Related U.S. Application Data

(63) Continuation of application No. PCT/CN2022/100043, filed on Jun. 21, 2022.

(30) Foreign Application Priority Data

Jun. 29, 2021 (CN) .......................... 202110727442.6

(51) Int. Cl.
    *H04W 4/00* (2018.01)
    *H03M 7/30* (2006.01)
    (Continued)

(52) U.S. Cl.
    CPC ............ *H04L 1/0041* (2013.01); *H03M 7/30* (2013.01); *H04W 28/04* (2013.01); *H03M 13/47* (2013.01);
    (Continued)

(58) Field of Classification Search
    None
    See application file for complete search history.

(56) References Cited

U.S. PATENT DOCUMENTS 12,519,515 B2 * 1/2026 Zhu ...................... H04B 7/0482
2014/0140189 A1 * 5/2014 Shattil ................. H04L 27/2602
                                                          370/208

(Continued)

OTHER PUBLICATIONS

Emin Martinian et al: "Delay-Optimal Burst Erasure Code Construction" Information Theory, 2007. ISIT 2007. IEEE International Symposium on. IEEE. Piscataway. NJ. USA. Jun. 24, 2007 (Jun. 24, 2007), pp. 1006-1010, XP031440847.

(Continued)

*Primary Examiner* — Bob A Phunkulh
(74) *Attorney, Agent, or Firm* — HAUPTMAN HAM, LLP

(57) ABSTRACT

A method includes obtaining T first data blocks and coding coefficients corresponding to original data packets in the T first data blocks. The method also includes encoding the original data packets in the T first data blocks using the coding coefficients and respective bit rates of first B first data blocks in the T first data blocks to obtain (T+B) second data blocks. First T second data blocks in the (T+B) second data blocks are the T first data blocks, last B second data blocks in the (T+B) second data blocks are B encoded data blocks, and a quantity of encoded data packets is related to a quantity of original data packets in the first B first data blocks and a bit rate of the first data block. The method further includes sending the (T+B) second data blocks.

20 Claims, 14 Drawing Sheets

300

Transmitting end                          Receiving end

310: Obtain T first data blocks and coding coefficients corresponding to original data packets in the T first data blocks 320: Encode the original data packets in the T first data blocks by using the coding coefficients and respective bit rates of first B first data blocks in the T first data blocks, to obtain (T+B) second data blocks 330: (T+B) second data blocks 340: Decode correctly received data packets in the (T+B) second data blocks, to obtain all data packets included in the T first data blocks

(51) Int. Cl.

| | |
|---|---|
| *H04L 1/00* | (2006.01) |
| *H04W 28/04* | (2009.01) |
| *H03M 13/00* | (2006.01) |
| *H03M 13/47* | (2006.01) |

(52) U.S. Cl.
CPC ......... *H03M 13/616* (2013.01); *H04L 1/0075* (2013.01); *H04L 1/0076* (2013.01)

(56) References Cited

U.S. PATENT DOCUMENTS

| | | | | |
|---|---|---|---|---|
| 2014/0146916 A1* | 5/2014 | Shattil | .................. | H04J 13/004 |
| | | | | 375/295 |
| 2014/0146924 A1* | 5/2014 | Shattil | .................. | H04L 1/0681 |
| | | | | 375/340 |

| | | | | |
|---|---|---|---|---|
| 2014/0317222 A1* | 10/2014 | Li | ...................... | H04L 67/1095 |
| | | | | 709/213 |
| 2015/0227425 A1* | 8/2015 | Li | ...................... | G06F 11/1076 |
| | | | | 714/766 |
| 2015/0281406 A1* | 10/2015 | Lucani | ............. | H03M 13/3761 |
| | | | | 370/477 |
| 2017/0179979 A1* | 6/2017 | Hussain | ............. | G06F 11/1076 |
| 2017/0188203 A1* | 6/2017 | Goseling | ................ | H04W 4/06 |
| 2018/0121286 A1* | 5/2018 | Sipos | ................. | H03M 13/373 |
| 2022/0173834 A1* | 6/2022 | Vidal | ................... | H04L 1/0076 |

OTHER PUBLICATIONS

Extended European Search Report issued in corresponding European Application No. 22831766.5, dated Sep. 24, 2024, pp. 1-10.

\* cited by examiner (a) Point-to-point
connection (b) Multi-hop single
connection

X2

Macro base
station

Micro base
station (c) DC dual
connection (d) Multi-hop
multi-connection

First matrix      Check matrix

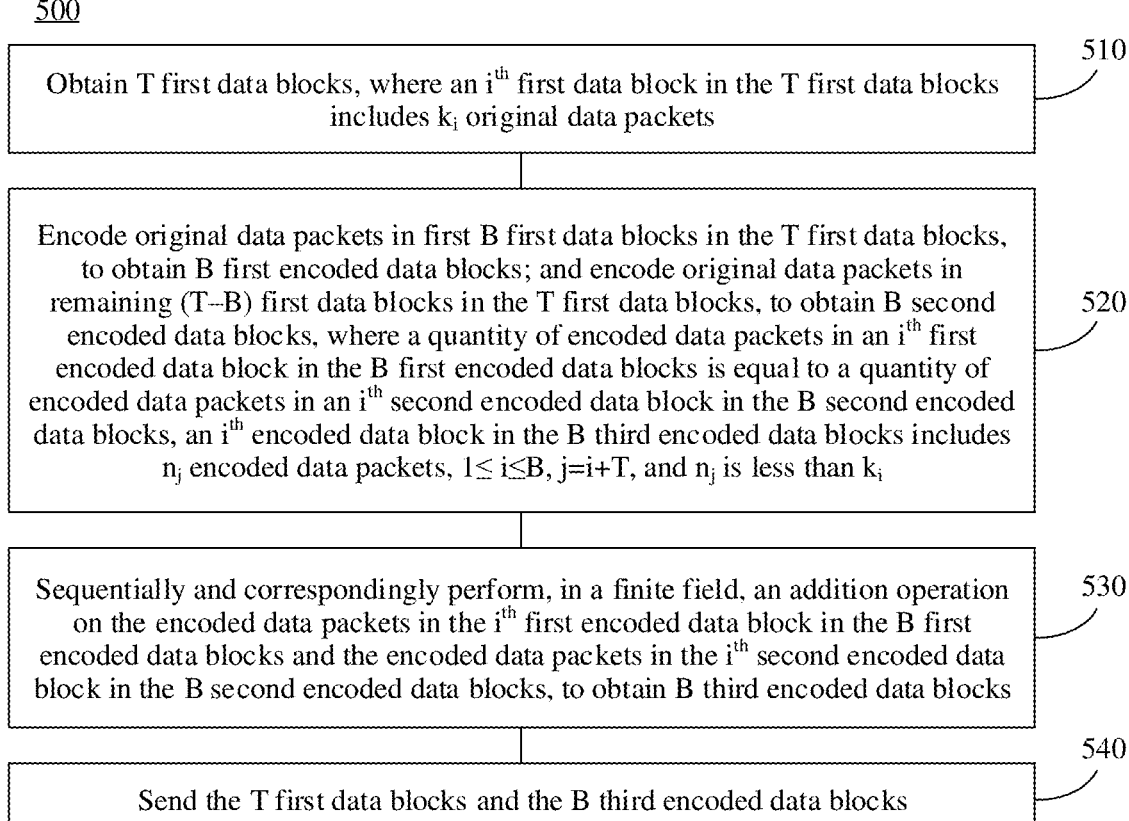

<u>500</u>

Obtain T first data blocks, where an $i^{th}$ first data block in the T first data blocks includes $k_i$ original data packets          510

Encode original data packets in first B first data blocks in the T first data blocks, to obtain B first encoded data blocks; and encode original data packets in remaining (T–B) first data blocks in the T first data blocks, to obtain B second encoded data blocks, where a quantity of encoded data packets in an $i^{th}$ first encoded data block in the B first encoded data blocks is equal to a quantity of encoded data packets in an $i^{th}$ second encoded data block in the B second encoded data blocks, an $i^{th}$ encoded data block in the B third encoded data blocks includes $n_j$ encoded data packets, $1 \leq i \leq B$, $j=i+T$, and $n_j$ is less than $k_i$          520

Sequentially and correspondingly perform, in a finite field, an addition operation on the encoded data packets in the $i^{th}$ first encoded data block in the B first encoded data blocks and the encoded data packets in the $i^{th}$ second encoded data block in the B second encoded data blocks, to obtain B third encoded data blocks          530

Send the T first data blocks and the B third encoded data blocks          540

| | 810 |
|---|---|
| Obtain T original data packets, where first redundancy versions are used for the T original data packets | |

| | 820 |
|---|---|
| Encode first redundancy versions of last (T–B) original data packets in the T original data packets, to obtain B first encoded data packets | |

| | 830 |
|---|---|
| Sequentially and correspondingly perform, in a finite field, addition on the B first encoded data packets and second redundancy versions of first B original data packets in the T original data packets, to obtain B second encoded data packets | |

| | 840 |
|---|---|
| Send the T original data packets and the B second encoded data packets | |

FIG. 12

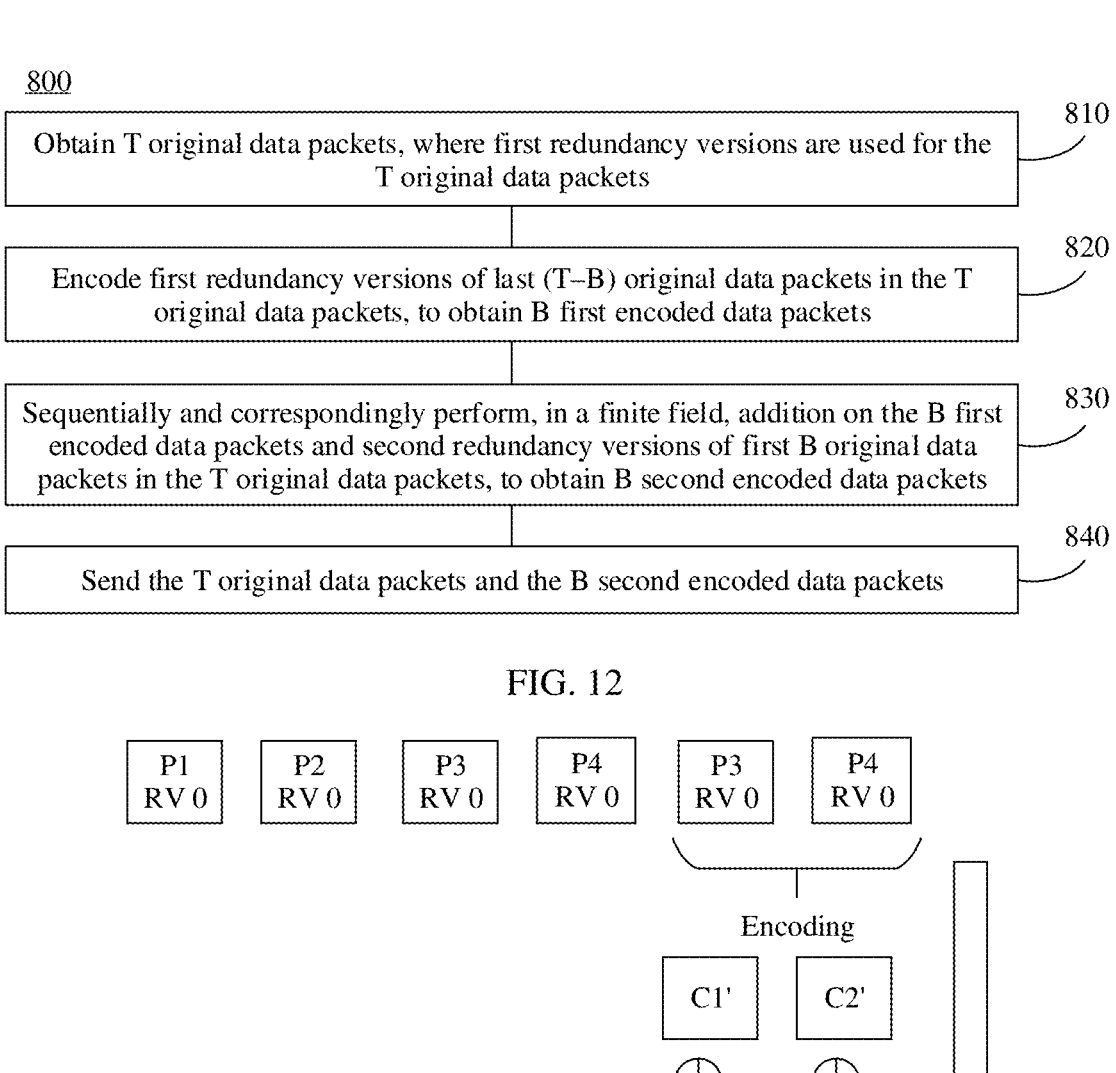

Figure 14:
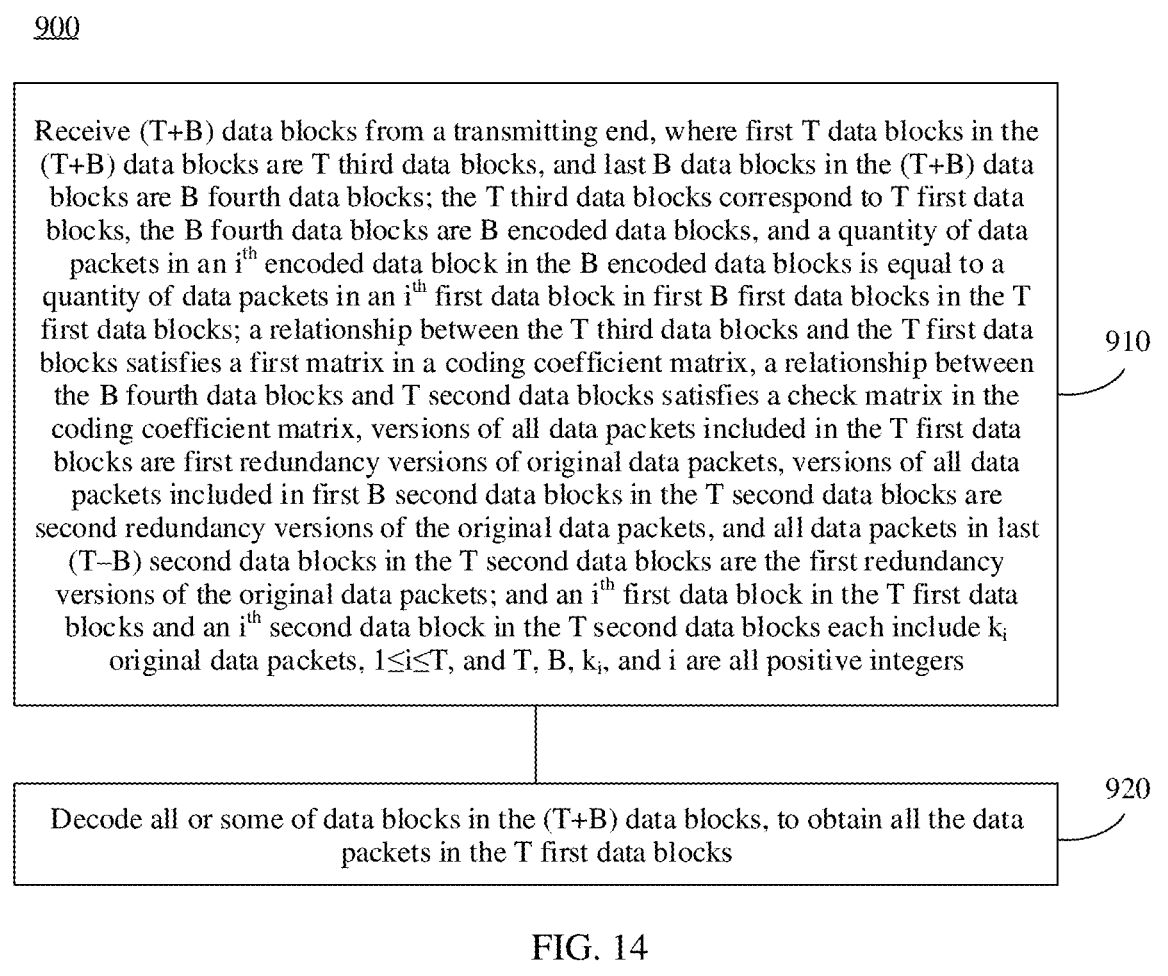

Receive (T+B) data blocks from a transmitting end, where first T data blocks in the (T+B) data blocks are T third data blocks, and last B data blocks in the (T+B) data blocks are B fourth data blocks; the T third data blocks correspond to T first data blocks, the B fourth data blocks are B encoded data blocks, and a quantity of data packets in an $i^{th}$ encoded data block in the B encoded data blocks is equal to a quantity of data packets in an $i^{th}$ first data block in first B first data blocks in the T first data blocks; a relationship between the T third data blocks and the T first data blocks satisfies a first matrix in a coding coefficient matrix, a relationship between the B fourth data blocks and T second data blocks satisfies a check matrix in the coding coefficient matrix, versions of all data packets included in the T first data blocks are first redundancy versions of original data packets, versions of all data packets included in first B second data blocks in the T second data blocks are second redundancy versions of the original data packets, and all data packets in last (T−B) second data blocks in the T second data blocks are the first redundancy versions of the original data packets; and an $i^{th}$ first data block in the T first data blocks and an $i^{th}$ second data block in the T second data blocks each include $k_i$ original data packets, $1 \leq i \leq T$, and T, B, $k_i$, and i are all positive integers

910

Decode all or some of data blocks in the (T+B) data blocks, to obtain all the data packets in the T first data blocks

DATA SENDING METHOD, DATA RECEIVING METHOD, AND COMMUNICATION APPARATUS

CROSS REFERENCE TO RELATED APPLICATIONS

This application is a continuation of International Application No. PCT/CN2022/100043, filed on Jun. 21, 2022, which claims priority to Chinese Patent Application No. 202110727442.6, filed on Jun. 29, 2021. The disclosures of the aforementioned applications are hereby incorporated by reference in their entireties.

TECHNICAL FIELD

This application relates to the field of wireless communication technologies, and more specifically, to a data sending method, a data receiving method, and a communication apparatus.

BACKGROUND

An extended reality (XR) service in new radio (NR) implements basic interaction between human and a virtual world, and has a low-latency requirement.

A network coding technology is a method to encode several data packets of an equal size are encoded to obtain encoded data packets, and decode sufficient encoded data packets to recover original data packets. This technology has been proved to be a method that can effectively improve transmission performance of a wireless communication system. In an existing network coding technology, a receiving end needs to correctly receive sufficient data packets before performing decoding. A transmitting end encodes K original data packets to obtain N encoded data packets, and sends the N encoded data packets; and the receiving end needs to correctly receive K data packets in the N encoded data packets to ensure that the K original data packets are correctly decoded, where N is greater than K, and both N and K are positive integers.

If an encoded data packet sent at a moment is incorrect, after a time of a maximum latency allowed in the communication system, because the receiving end cannot ensure that the K encoded data packets are correctly received, it cannot be ensured that the K original data packets are correctly decoded. In other words, the K original data packets are correctly decoded at a moment when the receiving end correctly receives the K encoded data packets. It can be learned that a decoding latency may not meet a low-latency requirement.

SUMMARY

This application provides a data sending method, a data receiving method, and a communication apparatus. In this way, if there is an incorrect data packet in a data block sent by a transmitting end, it can be ensured that decoding and recovery are performed on the incorrect data block within a maximum latency T allowed in a communication system, so that a low-latency requirement is met.

According to a first aspect, a data sending method is provided, and may be applied to a transmitting end in wireless communication, or may be applied to a chip or a chip system of a transmitting end. The following uses the transmitting end as an example, and the method includes:

The transmitting end obtains T first data blocks and coding coefficients corresponding to original data packets in the T first data blocks, where an $i^{th}$ first data block in the T first data blocks includes $k_i$ original data packets, $1 \leq i \leq T$, and T, $k_i$, and i are all positive integers;

the coding coefficients satisfy the following coding coefficient matrix:

a size of the coding coefficient matrix is T rows by (T+B) columns, and an element in row i and column j in the coding coefficient matrix is represented as $a_{i,j}$, where $1 \leq i \leq T$, $1 \leq j \leq (T+B)$, j is an integer, the coding coefficient matrix is constituted by a first matrix whose size is T rows by T columns and a check matrix whose size is T rows by B columns, the first matrix is located on a left side of the check matrix, and B is a positive integer;

the first matrix includes T×T elements, each element is a matrix, T elements on a diagonal of the first matrix are all identity matrices, remaining elements are zero matrices, and the first matrix includes the element $a_{i,j}$ in the coding coefficient matrix, where i=1, 2, . . . , B, (B+1), . . . , T, j=1, 2, . . . , T, and an element $a_{i,j}$ in the T elements includes $k_i \times k_j$ coding coefficients; the check matrix includes a first submatrix whose size is B×B and a second submatrix whose size is (T−B)×B, and the check matrix includes the element $a_{i,j}$ in the coding coefficient matrix, where i=1, 2, . . . , T, j=(T+1), (T+2), . . . , (T+B), and an element $a_{i,j}$ in the check matrix is a $k_i \times n_j$ matrix; and the first submatrix is located on an upper side of the second submatrix, the first submatrix includes elements in first B rows and last B columns in the coding coefficient matrix, and the second submatrix includes elements in last (T−B) rows and the last B columns in the coding coefficient matrix;

the first submatrix includes B×B elements, each element is a matrix, B elements on a diagonal of the first submatrix are non-zero matrices, remaining elements are zero matrices, and the first submatrix includes the element $a_{i,j}$ in the coding coefficient matrix, where i=1, 2, . . . , B, j=(T+1), (T+2), . . . , (T+B), and an element $a_{i,j}$ in the B elements includes $k_i$ rows and $n_j$ columns and includes $k_i \times n_j$ coding coefficients; and elements in the second submatrix and elements in last (T−B) rows and last (T−B) columns in the first matrix constitute a second matrix whose size is (T−B)×B, the second matrix is a generator matrix of a system MDS code, the second submatrix is a check part of the generator matrix, the second submatrix includes (T−B) rows and B columns, and the second submatrix includes the element $a_{i,j}$ in the coding coefficient matrix, where i=(B+1), (B+2), . . . , T, j=(T+1), (T+2), . . . , (T+B), and an element $a_{i,j}$ in the second submatrix includes $k_i \times n_j$ coding coefficients;

the transmitting end encodes the original data packets in the T first data blocks by using the coding coefficients and respective bit rates of first B first data blocks in the T first data blocks, to obtain (T+B) second data blocks, where first T second data blocks in the (T+B) second data blocks are the T first data blocks, last B second data blocks in the (T+B) second data blocks are B encoded data blocks, and a quantity of encoded data packets in an $i^{th}$ encoded data block in the B encoded data blocks is related to a quantity of original data packets in an $i^{th}$ first data block in the first B first data blocks and a bit rate of the $i^{th}$ first data block; and the transmitting end sends the (T+B) second data blocks.

According to the foregoing technical solution, the coding coefficient matrix that may be used to perform network coding on T original data blocks (that is, first data blocks) is designed, so that (T+B) data blocks are obtained through encoding. First T data blocks in the (T+B) data blocks are the T original data blocks before coding, and last B data blocks in the (T+B) data blocks are B encoded data blocks. In addition, a quantity of encoded data packets included in an $i^{th}$ encoded data block in the B encoded data blocks is related to a quantity of original data packets included in an $i^{th}$ original data block in the first T original data blocks and a bit rate of the $i^{th}$ original data block. In this solution, for an original data packet in each original data block, a decoding latency is not greater than T, so that a low-latency requirement of a communication system can be met.

In addition, the quantity of encoded data packets included in the $i^{th}$ encoded data block in the B encoded data blocks is flexible and controllable. For example, an appropriate bit rate may be determined based on a factor such as a channel condition or the like, and a check part in the coding coefficient matrix is adjusted based on the bit rate of the $i^{th}$ first data block, to change the quantity of encoded data packets in the $i^{th}$ encoded data block in the B encoded data blocks. This can improve utilization of radio resources to a maximum extent.

It can be learned that, in the technical solution, performance of another aspect of the communication system, for example, utilization of radio resources, can also be improved while a low-latency requirement is met.

With reference to the first aspect, in some implementations of the first aspect, that a quantity of encoded data packets in an $i^{th}$ encoded data block in the B encoded data blocks is related to a quantity of original data packets in an $i^{th}$ first data block in the first B first data blocks and a bit rate of the $i^{th}$ first data block includes:

The quantity of encoded data packets in the $i^{th}$ encoded data block in the B encoded data blocks, the quantity of original data packets in the $i^{th}$ first data block in the first B first data blocks, and the bit rate of the $i^{th}$ first data block satisfy the following function relation:

$$r_i = k_i/(k_i + n_j), \text{ where } i = 1, 2, \ldots, B, \text{ and } j = i + T; \text{ and}$$

the $i^{th}$ encoded data block in the B encoded data blocks is a $j^{th}$ data block in the (T+B) second data blocks, $r_i$ represents the bit rate of the $i^{th}$ first data block in the first B first data blocks, $k_i$ represents the quantity of original data packets in the $i^{th}$ first data block in the first B first data blocks, $n_j$ represents the quantity of encoded data packets in the $i^{th}$ encoded data block in the B encoded data blocks, and "/" represents a division operation.

In this implementation, due to a brilliant design concept of the coding coefficient matrix, the quantity of encoded data packets included in the $i^{th}$ encoded data block in the B encoded data blocks is flexible and controllable. For example, the transmitting end may determine, based on a factor such as a channel condition or the like, a bit rate appropriate for the $i^{th}$ original data block, and adjust the check part in the coding coefficient matrix based on the bit rate of the $i^{th}$ original data block, to change the quantity of encoded data packets included in the $i^{th}$ encoded data block in the B encoded data blocks and adapt to adjustment of the bit rate. This can improve utilization of radio resources to a maximum extent.

In addition, adjustment of quantities of encoded data packets in the B encoded data blocks is independent of each other. In other words, bit rates of all original data blocks in the T original data blocks are independent of each other. The transmitting end may separately perform adjustment for each data block. This can flexibly adapt to a change of the channel condition, and optimize performance of the communication system in real time.

With reference to the first aspect, in some implementations of the first aspect, different second data blocks in the (T+B) second data blocks are transmitted in different time units, and the time unit includes one or more slots, or the time unit includes one or more symbols.

In other words, one data block is sent in one time unit, and the data block may be an original data block or an encoded data block.

According to a second aspect, a data sending method is provided, and may be applied to a transmitting end in wireless communication, or may be applied to a chip or a chip system of a transmitting end. The following uses the transmitting end as an example, and the method includes:

The transmitting end obtains T first data blocks, where an $i^{th}$ first data block in the T first data blocks includes $k_i$ original data packets, $1 \le i \le T$, and T, $k_i$, and i are all positive integers;

the transmitting end encodes data packets in first B first data blocks in the T first data blocks, to obtain B first encoded data blocks; and encodes data packets in remaining (T–B) first data blocks in the T first data blocks, to obtain B second encoded data blocks, where a quantity of encoded data packets in an $i^{th}$ first encoded data block in the B first encoded data blocks is equal to a quantity of encoded data packets in an $i^{th}$ second encoded data block in the B second encoded data blocks;

the transmitting end sequentially and correspondingly performs, in a finite field, an addition operation on the encoded data packets in the $i^{th}$ first encoded data block in the B first encoded data blocks and the encoded data packets in the $i^{th}$ second encoded data block in the B second encoded data blocks, to obtain B third encoded data blocks, where an $i^{th}$ third encoded data block in the B third encoded data blocks includes $n_j$ encoded data packets, $1 \le i \le B$, $j = i + T$, $n_j$ is less than $k_i$, and B, T, i, $n_j$, and j are all positive integers; and the transmitting end sends the T first data blocks and the B third encoded data blocks.

With reference to the second aspect, in some implementations of the second aspect, all first data blocks in the T first data blocks and all third encoded data blocks in the B third encoded data blocks are transmitted in different time units, and the time unit includes one or more slots, or the time unit includes one or more symbols.

It should be noted that a description of the method in the second aspect is an equivalent description of the method in the first aspect. For beneficial technical effects of the method in the second aspect, refer to the description in the first aspect. Details are not described again.

According to a third aspect, a data sending method is provided, and may be applied to a transmitting end in wireless communication, or may be applied to a chip or a chip system of a transmitting end. The following uses the transmitting end as an example, and the method includes:

The transmitting end obtains T first data blocks, T second data blocks, and coding coefficients corresponding to original data packets in the T first data blocks and original data packets in the T second data blocks, where an $i^{th}$ first data block in the T first data blocks and an $i^{th}$ second data block in the T second data blocks each include $k_i$ original data packets, versions of the original data packets included in the T first data blocks are first redundancy versions, versions of original data packets included in first B second data blocks in the T second data blocks are second redundancy versions, versions of original data packets in last (T−B) second data blocks in the T second data blocks are the first redundancy versions, and T, B, $k_i$, and i are all positive integers;

the coding coefficients satisfy the following coding coefficient matrix:

a size of the coding coefficient matrix is T rows by (T+B) columns, the coding coefficient matrix includes a first matrix whose size is T rows by T columns and a check matrix whose size is T rows by B columns, and the first matrix is located on a left side of the check matrix;

the first matrix includes T×T elements, each element is a matrix, T elements on a diagonal of the first matrix are all identity matrices, remaining elements are zero matrices, an $i^{th}$ element in the T elements includes $k_i \times k_i$ coding coefficients, and $1 \le i \le T$;

the check matrix includes a first submatrix whose size is B×B and a second submatrix whose size is (T−B)×B; and the first submatrix includes B×B elements, B elements on a diagonal of the first submatrix are all identity matrices, and remaining elements are zero matrices; and elements in the second submatrix and elements in last (T−B) rows and last (T−B) columns in the first matrix constitute a second matrix whose size is (T−B)×B, the second matrix is a generator matrix of a system MDS code, and the second submatrix is a check part of the generator matrix;

the transmitting end encodes the original data packets in the T first data blocks by using coding coefficients in the first matrix, to obtain T third data blocks;

the transmitting end encodes the original data packets in the T second data blocks by using coding coefficients in the check matrix, to obtain B fourth data blocks, where the T third data blocks are the T first data blocks, the B fourth data blocks are B encoded data blocks, each encoded data block includes one or more encoded data packets, and a quantity of data packets in an $i^{th}$ encoded data block in the B encoded data blocks is equal to a quantity of data packets in an $i^{th}$ first data block in first B first data blocks in the T first data blocks; and the transmitting end sends the T third data blocks and the B fourth data blocks.

According to this technical solution, different redundancy versions are introduced for original data packets in T original data blocks (that is, the T first data blocks or the T second data blocks), and performs network coding on the different redundancy versions of the original data packets. For an original data packet in each original data block, a maximum decoding latency is T, so that a low-latency requirement of a communication system can be met.

In addition, a receiving end recovers an original data packet in an incorrect original data block by combining soft information of different redundant versions of an original data packet. In this way, decoding is enhanced, a decoding success probability can be increased, and decoding performance is improved.

With reference to the third aspect, in some implementations of the third aspect, different data blocks in the T third data blocks and the B fourth data blocks are transmitted in different time units, and the time unit includes one or more slots, or the time unit includes one or more symbols.

According to a fourth aspect, a data sending method is provided, and may be applied to a transmitting end in wireless communication, or may be applied to a chip or a chip system of a transmitting end. The following uses the transmitting end as an example, and the method includes:

The transmitting end obtains T first data blocks, where an $i^{th}$ first data block in the T first data blocks includes $k_i$ original data packets, and versions of original data packets included in the T first data blocks are first redundancy versions:

the transmitting end encodes original data packets included in last (T−B) first data blocks in the T first data blocks, to obtain B second data blocks;

the transmitting end performs, in a finite field, addition on original data packets in the B second data blocks and B third data blocks, to obtain B fourth data blocks, where the B third data blocks are first B first data blocks in the T first data blocks, versions of original data packets included in the B third data blocks are second redundancy versions of original data packets included in the first B first data blocks, and a quantity of original data packets in an $i^{th}$ third data block in the B third data blocks is equal to a quantity of data packets in an $i^{th}$ second data block in the B second data blocks; and the transmitting end sends the T first data blocks and the B fourth data blocks, where T and B are both positive integers.

With reference to the fourth aspect, in some implementations of the fourth aspect, all first data blocks in the T first data blocks and all fourth data blocks in the B fourth data blocks are transmitted in different time units, and the time unit includes one or more slots, or the time unit includes one or more symbols.

It should be noted that a description of the method in the fourth aspect is an equivalent description of the method in the third aspect. For beneficial technical effects of the method in the fourth aspect, refer to the description in the third aspect. Details are not described again.

According to a fifth aspect, a data receiving method is provided, and may be applied to a receiving end in wireless communication, or may be applied to a chip or a chip system of a receiving end. The following uses the receiving end as an example, and the method includes:

The receiving end receives (T+B) second data blocks, where first T second data blocks in the (T+B) second data blocks are T first data blocks, last B second data blocks in the (T+B) second data blocks are B encoded data blocks, and a quantity of encoded data packets in an $i^{th}$ encoded data block in the B encoded data blocks is related to a quantity of original data packets in an $i^{th}$ first data block in first B first data blocks and a bit rate of the $i^{th}$ first data block; and the receiving end decodes correctly received data packets in the (T+B) second data blocks, to obtain all data packets included in the T first data blocks, where a quantity $W_j$ of incorrect data packets in a $j^{th}$ second data block in first B second data blocks in the received second data blocks is not greater than a quantity $M_{j+T}$ of correctly received data packets in a $(j+T)^{th}$ second data block in the received second data blocks, and a total quantity $$\sum_{1}^{T} W_j$$

of incorrect data packets in the first T second data blocks in the received second data blocks is not greater than a total quantity $$\sum_{j=T+1}^{T+B} M_j$$

of correctly received data packets in the last B second data blocks in the received second data blocks, where $M_j$ represents a quantity of correctly received data packets in a $j^{th}$ second data block in the (T+B) second data blocks;

an $i^{th}$ first data block in the T first data blocks includes $k_i$ original data packets, $1 \leq i \leq T$, and T, B, $k_i$, and i are all positive integers;

the data packet in the T first data blocks and the data packet in the (T+B) second data blocks satisfy the following relationship of a coding coefficient matrix;

a size of the coding coefficient matrix is T rows by (T+B) columns, and an element in row i and column j in the coding coefficient matrix is represented as $a_{i,j}$, where $1 \leq i \leq T$, $1 \leq j \leq (T+B)$, j is an integer, the coding coefficient matrix is constituted by a first matrix whose size is T rows by T columns and a check matrix whose size is T rows by B columns, and the first matrix is located on a left side of the check matrix;

the first matrix includes T×T elements, each element is a matrix, T elements on a diagonal of the first matrix are all identity matrices, remaining elements are zero matrices, and the first matrix includes the element $a_{i,j}$ in the coding coefficient matrix, where i=1, 2, . . . , B, (B+1), . . . , T, j=1, 2, . . . , T, and an element $a_{i,j}$ in the T elements includes $k_i × k_j$ coding coefficients; the check matrix includes a first submatrix whose size is B×B and a second submatrix whose size is (T−B)×B, and the check matrix includes the element $a_{i,j}$ in the coding coefficient matrix, where i=1, 2, . . . , T, j=(T+1), (T+2), . . . , (T+B), and an element $a_{i,j}$ in the check matrix is a $k_i × n_j$ matrix; and the first submatrix is located on an upper side of the second submatrix, the first submatrix includes elements in first B rows and last B columns in the coding coefficient matrix, and the second submatrix includes elements in last (T−B) rows and the last B columns in the coding coefficient matrix;

the first submatrix includes B×B elements, each element is a matrix, B elements on a diagonal of the first submatrix are non-zero matrices, remaining elements are zero matrices, and the first submatrix includes the element $a_{i,j}$ in the coding coefficient matrix, where i=1, 2, . . . , B, j=(T+1), (T+2), . . . , (T+B), and an element $a_{i,j}$ in the B elements includes $k_i$ rows and $n_j$ columns and includes $k_i × n_j$ coding coefficients; and elements in the second submatrix and elements in last (T−B) rows and last (T−B) columns in the first matrix constitute a second matrix whose size is (T−B)×B, the second matrix is a generator matrix of a system maximum distance separable MDS code, the second submatrix is a check part of the generator matrix, the second submatrix includes (T−B) rows and B columns, the second submatrix includes (T−B)×B elements, and the second submatrix includes the element $a_{i,j}$ in the coding coefficient matrix, where i=(B+1), (B+2), . . . , T, j=(T+1), (T+2), . . . , (T+B), and an element $a_{i,j}$ included in the second submatrix is an element in row i and column j and includes $k_i × n_j$ coding coefficients.

It should be understood that the data receiving method in the fifth aspect corresponds to the data sending method in the first aspect. A possible implementation of the method in the first aspect may also be applied to the fifth aspect.

According to a sixth aspect, a data receiving method is provided, and may be applied to a receiving end in wireless communication, or may be applied to a chip or a chip system of a receiving end. The following uses the receiving end as an example, and the method includes:

The receiving end receives (T+B) data blocks, where first T data blocks are T third data blocks, last B data blocks are B fourth data blocks, the T third data blocks correspond to T first data blocks, the B fourth data blocks are B encoded data blocks, each encoded data block in the B encoded data blocks includes one or more encoded data packets, and a quantity of data packets in an $i^{th}$ encoded data block in the B encoded data blocks is equal to a quantity of data packets in an $i^{th}$ first data block in first B first data blocks in the T first data blocks; and the receiving end decodes all or a part of data blocks in the (T+B) data blocks, to obtain all data packets included in the T first data blocks, where a relationship between the T third data blocks and the T first data blocks satisfies a first matrix in the following coding coefficient matrix, a relationship between the B fourth data blocks and T second data blocks satisfies a check matrix in the coding coefficient matrix, versions of all the data packets included in the T first data blocks are first redundancy versions of original data packets, versions of all data packets included in first B second data blocks in the T second data blocks are second redundancy versions of the original data packets, and all data packets in last (T−B) second data blocks in the T second data blocks are the first redundancy versions of the original data packets;

an $i^{th}$ first data block in the T first data blocks and an $i^{th}$ second data block in the T second data blocks each include $k_i$ original data packets, $1 \leq i \leq T$, and T, B, $k_i$, and i are all positive integers;

a size of the coding coefficient matrix is T rows by (T+B) columns, the coding coefficient matrix includes the first matrix whose size is T rows by T columns and the check matrix whose size is T rows by B columns, and the first matrix is located on a left side of the check matrix;

the first matrix includes T×T elements, each element is a matrix, T elements on a diagonal of the first matrix are all identity matrices, remaining elements are zero matrices, an $i^{th}$ element in the T elements includes $k_i × k_i$ coding coefficients, and $1 \leq i \leq T$;

the check matrix includes a first submatrix whose size is B×B and a second submatrix whose size is (T−B)×B; and the first submatrix includes B×B elements, B elements on a diagonal of the first submatrix are all identity matrices, and remaining elements are zero matrices; and elements in the second submatrix and elements in last (T−B) rows and last (T−B) columns in the first matrix constitute a second matrix whose size is (T−B)×B, the second matrix is a generator matrix of a system maximum distance separable MDS code, and the second submatrix is a check part of the generator matrix.

It should be understood that the data receiving method in the sixth aspect corresponds to the data sending method in the third aspect. A possible implementation of the method in the third aspect may also be applied to the sixth aspect.

With reference to the sixth aspect, in some implementations of the sixth aspect, that the receiving end decodes all or a part of data blocks in the (T+B) data blocks, to obtain all data packets included in the T first data blocks includes:

The receiving end determines a quantity Q and positions of incorrect data blocks in the (T+B) data blocks, where Q is a nonnegative integer; and the receiving end decodes all or the part of data blocks in the (T+B) data blocks based on the quantity Q and positions of incorrect data blocks, to obtain all the data packets included in the T first data blocks.

With reference to the sixth aspect, in some implementations of the sixth aspect, that the receiving end decodes all or the part of data blocks in the (T+B) data blocks based on the quantity Q and positions of incorrect data blocks includes:

If Q is greater than B, and the Q incorrect data blocks are any Q data blocks in the B data blocks in a first data block set and the B fourth data blocks, the receiving end decodes the B fourth data blocks and the data blocks that are in the first data block set; or if Q is greater than B, and one or more incorrect data blocks in the Q incorrect data blocks are the B data blocks included in a second data block set, the receiving end skips performing decoding, where first B third data blocks in the T third data blocks constitute the first data block set, and last (T–B) third data blocks in the first T third data blocks constitute the second data block set.

In this implementation, after the receiving end receives the (T+B) data blocks, in one case, if the receiving end determines that the (T–B) data blocks participating in system MDS coding are correct, there is no requirement on correctness and incorrectness of the other 2B data blocks. In other words, in this case, joint decoding may be performed on two different RVs of an incorrect data packet in an incorrect data block in this solution, so that correction of more than B contiguous incorrect data blocks is supported. This improves an error resistance capability of a communication system.

In another case, if one or more incorrect data blocks are data blocks in the (T–B) data blocks participating in MDS coding, the receiving end determines that decoding cannot be successfully performed. Therefore, decoding may not be performed, so that a decoding process is simplified.

With reference to the sixth aspect, in some implementations of the sixth aspect, that the receiving end decodes all or a part of data blocks in the (T+B) data blocks includes:

The receiving end obtains different redundancy versions of data packets in all or the part of data blocks in the (T+B) data blocks; and the receiving end recovers incorrect data packets in the Q incorrect data blocks by using the different redundancy versions of the data packets in all or the part of data blocks.

With reference to the sixth aspect, in some implementations of the sixth aspect, that the receiving end decodes all or the part of data blocks in the (T+B) data blocks based on the quantity Q and positions of incorrect data blocks includes:

If Q is less than or equal to B, and the Q incorrect data blocks are any Q data blocks in B contiguous data blocks in the (T+B) data blocks, the receiving end decodes correct data blocks in the (T+B) data blocks.

In this case, the receiving end can still correct B contiguous incorrect data blocks by combining soft information of different redundancy versions of a data packet. This optimizes an error correction capability of the communication system.

With reference to the sixth aspect, in some implementations of the sixth aspect, that the receiving end decodes all or the part of data blocks in the (T+B) data blocks based on the quantity Q and positions of incorrect data blocks includes:

If Q is less than or equal to B, and the Q incorrect data blocks are any Q data blocks in the (T+B) data blocks, the receiving end decodes all the data blocks in the (T+B) data blocks.

In this case, there is a relatively high probability that the receiving end can recover an incorrect original data packet by combining different RVs of an original data packet. Therefore, decoding may be performed, to improve a decoding success rate.

According to a seventh aspect, a data sending method is provided, and may be applied to a transmitting end in wireless communication, or may be applied to a chip or a chip system of a transmitting end. The following uses the transmitting end as an example, and the method includes:

The transmitting end sends an $(i+T)^{th}$ data block, where the $(i+T)^{th}$ data block includes an original data packet and an encoded data packet, the encoded data packet is obtained by encoding the original data packet in the $(i+T)^{th}$ data block and an original data packet in an $i^{th}$ data block, T represents a quantity of time units of a maximum latency allowed for the original data packet in the $i^{th}$ data block, and one data block is transmitted in one time unit.

In this technical solution, the transmitting end provides protection with a maximum latency of T for each data block. If the $i^{th}$ data block is incorrect, the receiving end performs decoding and recovery on the $i^{th}$ data block by using the $(i+T)^{th}$ data block within the maximum latency T. Enhanced decoding on the $i^{th}$ data block can improve decoding performance of a communication system.

With reference to the seventh aspect, in some implementations of the seventh aspect, that the encoded data packet is obtained by encoding the original data packet in the $(i+T)^{th}$ data block and an original data packet in an $i^{th}$ data block includes:

The encoded data packet is obtained by encoding the original data packet in the $(i+T)^{th}$ data block, the original data packet in the $i^{th}$ data block, and an original data packet or original data packets in one or more data blocks between the $i^{th}$ data block and the $(i+T)^{th}$ data block.

With reference to the seventh aspect, in some implementations of the seventh aspect, the method further includes:

The transmitting end receives feedback information that is for an $(i+T-1)^{th}$ data block and that is from a receiving end, where the feedback information indicates that the $i^{th}$ data block is incorrectly decoded, and indicates a quantity of encoded data packets required for correctly decoding the $i^{th}$ data block; and the transmitting end determines, based on the feedback information, that the $i^{th}$ data block is incorrectly decoded, where the encoded data packet in the $(i+T)^{th}$ data block is obtained by encoding the original data packet in the $i^{th}$ data block and the original data packet in the $(i+T)^{th}$ data block.

In this implementation, an association depth and a quantity of encoded data packets of convolutional network coding can be optimized by using the feedback information while a maximum-latency requirement is met. This also improves decoding performance, avoids overheads caused by a redundant encoded packet, and improves system performance.

With reference to the seventh aspect, in some implementations of the seventh aspect, the method further includes:

The transmitting end receives feedback information that is for an $(i+T-1)^{th}$ data block and that is from a receiving end, where the feedback information indicates that the $i^{th}$ data block is correctly decoded, and indicates quantities of incorrect original data packets and incorrect encoded data packets in the $(i+T-1)^{th}$ data block;

the transmitting end determines, based on the feedback information, that the $i^{th}$ data block is correctly decoded; and the transmitting end determines an association depth w of the $(i+T)^{th}$ data block and a quantity of encoded data packets based on the feedback information, where the encoded data packet in the $(i+T)^{th}$ data block is obtained by encoding the original data packet in the $(i+T)^{th}$ data block, an original data packet in an $(i+T-w+1)^{th}$ data block, and an original data packet or original data packets in one or more data blocks between the $(i+T)^{th}$ data block and the $(i+T-w+1)^{th}$ data block.

Optionally, in this implementation, the feedback information may further directly indicate one or more of the association depth of the $(i+T)^{th}$ data block and the quantity of encoded data packets. For example, the feedback information includes an index, and the index has a correspondence with one or more of the association depth and the quantity of encoded data packets. The receiving end may determine the association depth w of the $(i+T)^{th}$ data block and the quantity of encoded data packets based on the index and the correspondence.

In this implementation, an association depth and a quantity of encoded data packets of convolutional network coding can be optimized by using the feedback information while a maximum-latency requirement is met. This also improves decoding performance, avoids overheads caused by a redundant encoded packet, and improves system performance.

With reference to the seventh aspect, in some implementations of the seventh aspect, in the foregoing implementation in which the feedback information is introduced, the time unit of the maximum latency is a period of the feedback information.

According to an eighth aspect, a data receiving method is provided, and may be applied to a receiving end in wireless communication, or may be applied to a chip or a chip system of a receiving end. The following uses the receiving end as an example, and the method includes:

The receiving end receives an $(i+T)^{th}$ data block, where the $(i+T)^{th}$ data block includes an original data packet and an encoded data packet, the encoded data packet and a first data packet set satisfy a coding relationship, the first data packet set includes the original data packet in the $(i+T)^{th}$ data block and an original data packet in an $i^{th}$ data block, T represents a quantity of time units of a maximum latency allowed for the original data packet in the $i^{th}$ data block, and one data block is transmitted in one time unit.

Further, the method may include:

performing decoding based on the $(i+T)^{th}$ data block in combination with the $i^{th}$ data block, to recover the original data packet in the $i^{th}$ data block, or recover the original data packet in the $i^{th}$ data block and the original data packet in the $(i+T)^{th}$ data block.

With reference to the eighth aspect, in some implementations of the eighth aspect, that the encoded data packet is obtained by encoding the original data packet in the $(i+T)^{th}$ data block and an original data packet in an $i^{th}$ data block includes:

The encoded data packet is obtained by encoding the original data packet in the $(i+T)^{th}$ data block, the original data packet in the $i^{th}$ data block, and an original data packet or original data packets in one or more data blocks between the $i^{th}$ data block and the $(i+T)^{th}$ data block.

With reference to the eighth aspect, in some implementations of the eighth aspect, the method further includes:

The receiving end determines that the $i^{th}$ data block is incorrectly decoded; and the receiving end sends feedback information for an $(i+T-1)^{th}$ data block, where the feedback information indicates that the $i^{th}$ data block is incorrectly decoded, and indicates a quantity of encoded data packets required for correctly decoding the $i^{th}$ data block.

With reference to the eighth aspect, in some implementations of the eighth aspect, the method further includes:

The receiving end determines that the $i^{th}$ data block is correctly decoded; and the receiving end sends feedback information for an $(i+T-1)^{th}$ data block, where the feedback information indicates that the $i^{th}$ data block is correctly decoded, and indicates quantities of incorrect original data packets and incorrect encoded data packets in the $(i+T-1)^{th}$ data block.

Optionally, in this implementation, the feedback information may further directly indicate one or more of an association depth of the $(i+T)^{th}$ data block and a quantity of encoded data packets. For example, the feedback information includes an index, and the index has a correspondence with one or more of the association depth and the quantity of encoded data packets. The receiving end may determine the association depth w of the $(i+T)^{th}$ data block and the quantity of encoded data packets based on the index and the correspondence.

With reference to the eighth aspect, in some implementations of the eighth aspect, the time unit of the maximum latency is a period of the feedback information.

According to a ninth aspect, a communication apparatus is provided. The communication apparatus has a function of implementing the method in any one of the first aspect to the fourth aspect and the seventh aspect, or any possible implementation in any one of these aspects. The function may be implemented by hardware, or may be implemented by hardware executing corresponding software. The hardware or the software includes one or more units corresponding to the foregoing function. The encoding process in the foregoing method may be implemented by an encoder or a codec. Optionally, the encoder or the codec may be implemented by a circuit (for example, a digital circuit).

According to a tenth aspect, a communication apparatus is provided. The communication apparatus has a function of implementing the method in any one of the fifth aspect, the sixth aspect, and the eighth aspect, or any possible implementation in any one of these aspects. The function may be implemented by hardware, or may be implemented by hardware executing corresponding software. The hardware or the software includes one or more units corresponding to the foregoing function. The decoding process in the foregoing method may be implemented by a decoder or a codec. Optionally, the decoder or the codec may be implemented by a circuit (for example, a digital circuit).

According to an eleventh aspect, a communication apparatus is provided, and includes a processor and a memory. Optionally, a transceiver may be further included. The memory is configured to store a computer program. The processor is configured to: invoke and run the computer program stored in the memory, and control the transceiver to receive and send a signal, so that the communication apparatus performs the method in any one of the first aspect to the fourth aspect and the seventh aspect, or any possible implementation in any one of these aspects.

For example, the communication apparatus is a transmitting end in wireless communication.

According to a twelfth aspect, a communication apparatus is provided, and includes a processor and a memory. Optionally, a transceiver may be further included. The memory is configured to store a computer program. The processor is configured to: invoke and run the computer program stored in the memory, and control the transceiver to receive and send a signal, so that the communication apparatus performs the method in any one of the fifth aspect, the sixth aspect, and the eighth aspect, or any possible implementation in any one of these aspects.

For example, the communication apparatus is a receiving end in wireless communication.

According to a thirteenth aspect, a communication apparatus is provided, and includes a processor and a communication interface. The communication interface is configured to: receive data and/or information, and transmit the received data and/or information to the processor, the processor processes the data and/or information, and the communication interface is further configured to output data and/or information processed by the processor, so that the method in any one of the first aspect to the fourth aspect and the seventh aspect, or any possible implementation in any one of these aspects is performed.

According to a fourteenth aspect, a communication apparatus is provided, and includes a processor and a communication interface. The communication interface is configured to: receive (or referred to as input) data and/or information, and transmit the received data and/or information to the processor, the processor processes the data and/or information, and the communication interface is further configured to output data and/or information processed by the processor, so that the method in any one of the fifth aspect, the sixth aspect, and the eighth aspect, or any possible implementation in any one of these aspects is performed.

According to a fifteenth aspect, a computer-readable storage medium is provided. The computer-readable storage medium stores computer instructions. When the computer instructions are run on a computer, the method in any one of the first aspect to the fourth aspect and the seventh aspect, or any possible implementation in any one of these aspects is performed.

According to a sixteenth aspect, a computer-readable storage medium is provided. The computer-readable storage medium stores computer instructions. When the computer instructions are run on a computer, the method in any one of the fifth aspect, the sixth aspect, and the eighth aspect, or any possible implementation in any one of these aspects is performed.

According to a seventeenth aspect, a computer program product is provided. The computer program product includes computer program code. When the computer program code is run on a computer, the method in any one of the first aspect to the fourth aspect and the seventh aspect, or any possible implementation in any one of these aspects is performed.

According to an eighteenth aspect, a computer program product is provided. The computer program product includes computer program code. When the computer program code is run on a computer, the method in any one of the fifth aspect, the sixth aspect, and the eighth aspect, or any possible implementation in any one of these aspects is performed.

According to a nineteenth aspect, a wireless communication system is provided, and includes the communication apparatus in the ninth aspect and/or the communication apparatus in the tenth aspect.

BRIEF DESCRIPTION OF DRAWINGS

FIG. 6 is a schematic diagram of equivalent processing of a network coding process in Solution 1 according to this application;

FIG. 12 is a schematic diagram of equivalent processing of a network coding process in Solution 2 according to this application;

FIG. 13 shows an example of equivalent processing performed by a transmitting end in Solution 2;

FIG. 14 is a schematic diagram of a decoding procedure of a receiving end in Solution 2 according to this application;

DESCRIPTION OF EMBODIMENTS

Figure 1:
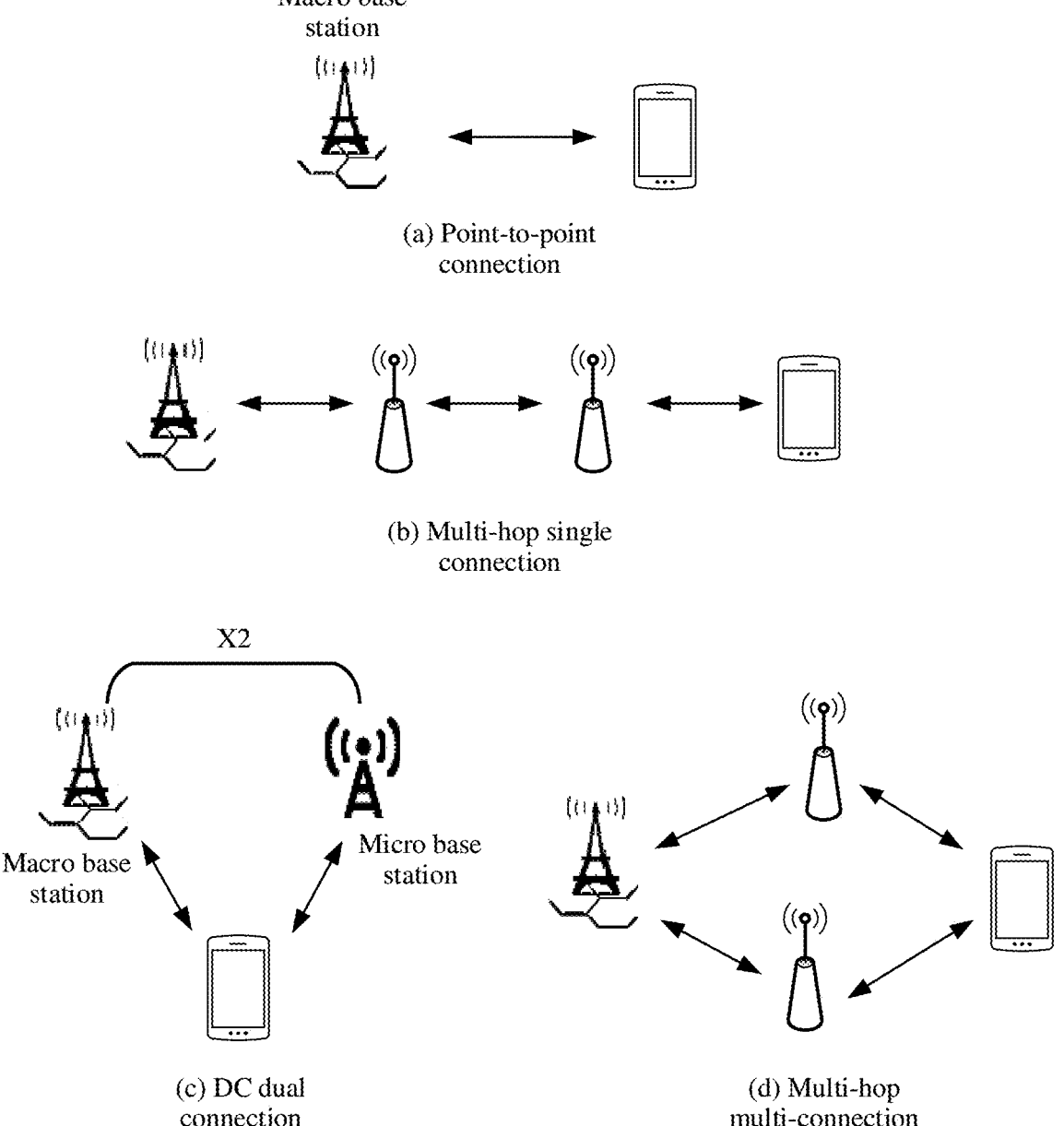
FIG. 1 is a schematic diagram of a scenario of a communication system applicable to this application.

The following describes technical solutions in embodiments of this application with reference to the accompanying drawings.

The technical solutions in embodiments of this application may be applied to various communication systems, including but not limited to: a 5th generation (5G) system or a new radio (NR) system, a long term evolution (LTE) system, an LTE frequency division duplex (FDD) system, an LTE time division duplex (TDD) system, and the like. The technical solutions provided in this application may also be applied to a future communication system, for example, a 6th generation mobile communication system. In addition, the technical solutions provided in this application may also be applied to device-to-device (D2D) communication, vehicle-to-everything (V2X) communication, machine-to-machine (M2M) communication, machine-type communication (MTC), an internet of things (IoT) communication system, another communication system, or the like.

A communication system applicable to this application may include one or more transmitting ends and one or more receiving ends. Optionally, one of the transmitting end and the receiving end may be a terminal device, and the other may be a network device. Alternatively, one of the transmitting end and the receiving end is a terminal device, and the other is another terminal device. Alternatively, one of the transmitting end and the receiving end is a network device, and the other is another network device.

For example, the terminal device may also be referred to as user equipment (UE), an access terminal, a subscriber unit, a subscriber station, a mobile console, a mobile station (MS), a mobile terminal (MT), a remote station, a remote terminal, a mobile device, a user terminal, a terminal, a wireless communication device, a user agent, or a user apparatus. The terminal device in embodiments of this application may be a device that provides voice and/or data connectivity for a user, and may be configured to connect to a person, an object, and a machine, for example, a handheld device or a vehicle-mounted device having a wireless connection function. The terminal device in embodiments of this application may be a mobile phone, a tablet computer (Pad), a notebook computer, a palmtop computer, a mobile internet device (MID), a wearable device, a virtual reality (VR) device, an augmented reality (AR) device, a wireless terminal in industrial control, a wireless terminal in self driving, a wireless terminal in remote medical surgery, a wireless terminal in a smart grid, a wireless terminal in transportation safety, a wireless terminal in a smart city, a wireless terminal in a smart home, or the like. Optionally, the UE may be configured to act as a base station. For example, the UE may act as a scheduling entity that provides a sidelink signal between UEs in V2X, D2D, or the like.

In embodiments of this application, an apparatus configured to implement a function of the terminal may be a terminal device, or may be an apparatus, for example, a chip system or a chip, that can support the terminal device in implementing the function. The apparatus may be installed in the terminal device. In embodiments of this application, the chip system may include a chip, or may include a chip and another discrete device.

For example, the network device may be a device having a wireless transceiver function. The network device may be a device that provides a wireless communication function service, is usually located on a network side, and includes but is not limited to: a next generation base station (gNB) in a 5th generation (5G) communication system, a base station in a 6th generation (6G) mobile communication system, a base station in a future mobile communication system, an access node in a wireless fidelity (Wi-Fi) system, an evolved NodeB (eNB) in a long term evolution (LTE) system, a radio network controller (RNC), a NodeB (NB), a base station controller (BSC), a home base station (for example, a home evolved NodeB, or a home NodeB, HNB), a baseband unit (BBU), a transmission reception point (TRP), a transmission point (TP), a base transceiver station (BTS), or the like. In a network structure, the network device may include a central unit (CU) node, a distributed unit (DU) node, a RAN device including a CU node and a DU node, or a RAN device including a control plane CU node, a user plane CU node, and a DU node. Alternatively, the network device may be a radio controller, a relay station, a vehicle-mounted device, a wearable device, or the like in a cloud radio access network (CRAN) scenario. In addition, the base station may be a macro base station, a micro base station, a relay node, a donor node, or a combination thereof. The base station may alternatively be a communication module, a modem, or a chip that is disposed in the foregoing device or apparatus. The base station may alternatively be a mobile switching center, a device that has a base station function in D2D, V2X, and M2M communication, a network side device in a 6G network, a device that has a base station function in a future communication system, or the like. The base station may support networks of a same access technology or different access technologies. This is not limited.

In embodiments of this application, an apparatus configured to implement a function of the network device may be a network device, or may be an apparatus, for example, a chip system or a chip, that can support the network device in implementing the corresponding function. The apparatus may be installed in the network device. In embodiments of this application, the chip system may include a chip, or may include a chip and another discrete device.

FIG. 1 is a schematic diagram of a scenario of a communication system applicable to this application. This application is applicable to a plurality of transmission scenarios such as an uplink, a downlink, an access link, a backhaul link, a sidelink, and the like, for example, a point-to-point single connection shown in (a) in FIG. 1, a multi-hop single connection shown in (b) in FIG. 1, a DC (dual connection or dual connectivity) shown in (c) in FIG. 1, and a multi-hop multi-connection shown in (d) in FIG. 1.

To facilitate understanding of the technical solutions in this application, technologies related to this application are first briefly described.

A network coding technology is a method to encode several data packets of an equal size are encoded to obtain encoded data packets, and decode sufficient encoded data packets to recover original data packets. This technology has been proved to be a method that can effectively improve transmission performance of a wireless communication system, especially for a solution in which a quantity of retransmissions is limited or even there is no retransmission opportunity. From another perspective, because information of several original data packets is combined in encoded data packets, when there are sufficient encoded data packets, the encoded data packets may be used to recover any related original data packet.

Further, in an existing network coding technology, if a quantity of original data packets is K, a transmitting end encodes the K original data packets, to obtain B encoded data packets. The transmitting end sends the K original data packets and the B encoded data packets. A receiving end needs to correctly receive the K original data packets and K linearly independent data packets in the B encoded data packets, to correctly decode the K original data packets. It should be understood that the K data packets herein may be any K data packets in (K+B) data packets including the K original data packets and the B encoded data packets. If a data packet sent at a moment t is incorrect, it cannot be ensured that the receiving end successfully performs decoding at a moment (T+t), because in this case, it cannot be ensured that the receiving end has correctly received the K linearly independent data packets. Therefore, a decoding latency of conventional network coding may be very large. This cannot meet a low-latency requirement of some services (for example, an XR service) in an NR system.

A typical network coding technology is referred to as a maximally short (MS) code. The maximally short code is mainly used to resolve burst consecutive errors, and may be represented as a (T+B, T) code. The MS code can be used to correct a maximum of B contiguous incorrect data blocks, and can meet a maximum latency T of a communication system, where T is greater than or equal to B, and T and B are both positive integers.

Figure 2:
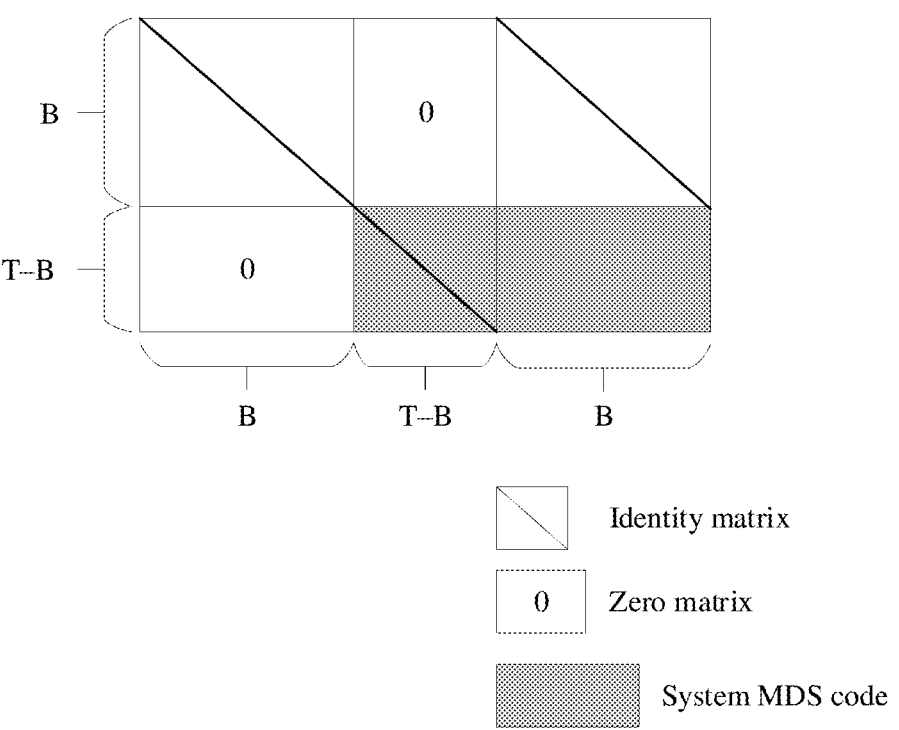
FIG. 2 is a diagram of a structure of a coding coefficient matrix of a conventional MS code.

FIG. 2 is a diagram of a structure of a coding coefficient matrix of a conventional MS code. As shown in FIG. 2, a transmitting end first sends T original data packets, where the T original data packets may also be referred to as system data packets; then performs joint encoding on first B original data packets and last (T−B) original data packets in the T original data packets by using a repetition code and a system maximum distance separable code (MDS) respectively, to obtain B encoded data packets; and sends the B encoded data packets.

According to a solution of the conventional MS code, a maximum of B contiguous incorrect data blocks can be corrected. According to this solution, if an original data packet sent by the transmitting end at a moment t is incorrect, the original data packet can be recovered when an encoded data packet is correctly received at a moment not exceeding (T+t). Therefore, a latency does not exceed T.

However, in an actual communication system, a transport block (TB) sent in a unit time usually includes a plurality of data packets, and that one TB is incorrect usually means that only a part of data packets are incorrect. If the solution of the conventional MS code is used when a TB is transmitted in the actual communication system, although a maximum-latency requirement can be ensured, a redundancy degree of an encoded data packet is relatively high. This causes a waste of radio resources, and results in unsatisfactory performance of the communication system.

In view of this, this application provides some data sending solutions, for example, Solution 1, Solution 2, and Solution 3 in the following, to meet a requirement of a communication system for a low latency and improve performance of the communication system while a disadvantage of the conventional MS code is overcome.

It should be noted that numbers "first" and "second" and letter numbers are independent of each other in Solution 1, Solution 2, and Solution 3 in this application. For example, "first data block", "second data block", and letter numbers in Solution 1 are applicable only to Solution 1. "First data block", "second data block", and letter numbers in Solution 2 are applicable only to Solution 2, and are irrelevant to those in Solution 1. This is also similar in Solution 3. Details are not described.

The following describes a data sending method and a corresponding data receiving method of a receiving end that are provided in this application.

Solution 1

A coding coefficient matrix that may be used to perform network coding on T original data blocks is designed, so that (T+B) data blocks are obtained through encoding. First T data blocks in the (T+B) data blocks are the T original data blocks before coding, and last B data blocks in the (T+B) data blocks are B encoded data blocks. In addition, a quantity of encoded data packets included in an $i^{th}$ encoded data block in the B encoded data blocks is related to a quantity of original data packets included in an $i^{th}$ original data block in the first T original data blocks and a bit rate of the $i^{th}$ original data block, $1 \le i \le B$, and T, B, and i are all integers. In other words, the quantity of encoded data packets included in the $i^{th}$ encoded data block in the B encoded data blocks is flexible and controllable. An appropriate bit rate may be determined based on a factor such as a channel condition or the like, and a check part in the coding coefficient matrix is adjusted based on an encoding bit rate of the $i^{th}$ original data block, to change the quantity of encoded data packets in the encoded data block. This can improve utilization of radio resources to a maximum extent.

Quantities of encoded data packets included in all encoded data blocks in the B encoded data blocks are independent of each other. The quantity of encoded data packets included in the $i^{th}$ encoded data block in the B encoded data blocks is related to a bit rate of an $i^{th}$ original data block in first B original data blocks in the T original data blocks.

It should be understood that, when each original data block in the T original data blocks includes one data packet, Solution 1 is also applicable.

In addition, Solution 1 can also meet a requirement of a communication system for a low latency. For an original data packet in each original data block, a maximum decoding latency is T.

Figure 3:
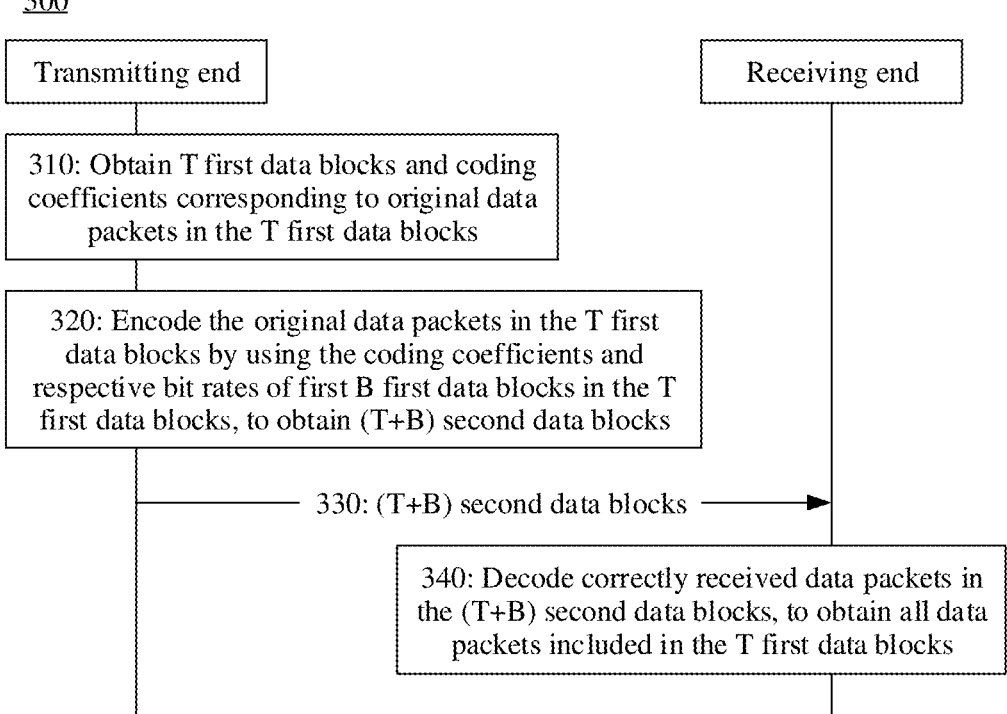
FIG. 3 is a schematic flowchart of a data sending and data receiving method according to this application.

The following describes Solution 1 in detail with reference to FIG. 3.

FIG. 3 is a schematic flowchart of a data sending method and a data receiving method according to this application.

310: A transmitting end obtains T first data blocks and coding coefficients corresponding to original data packets in the T first data blocks.

An $i^{th}$ first data block in the T first data blocks includes $k_i$ original data packets, $1 \le i \le T$, and T, $k_i$, and i are all positive integers.

The coding coefficients satisfy the following coding coefficient matrix:

A size of the coding coefficient matrix is T rows by (T+B) columns, and an element in row i and column j in the coding coefficient matrix is represented as $a_{i,j}$, where $1 \le i \le T$, $1 \le j \le (T+B)$, j is an integer, the coding coefficient matrix is constituted by a first matrix whose size is T rows by T columns and a check matrix whose size is T rows by B columns, and the first matrix is located on a left side of the check matrix.

The first matrix includes T×T elements, each element is a matrix, T elements on a diagonal of the first matrix are all identity matrices, remaining elements are zero matrices, and the first matrix includes the element $a_{i,j}$ in the coding coefficient matrix, where i=1, 2, . . . , B, (B+1), . . . , T, j=1, 2, . . . , T, and an element $a_{i,j}$ in the T elements includes $k_i \times k_j$ coding coefficients; the check matrix includes a first submatrix whose size is B×B and a second submatrix whose size is (T−B)×B, and the check matrix includes the element $a_{i,j}$ in the coding coefficient matrix, where i=1, 2, . . . , T, j=j=(T+1), (T+2), . . . , (T+B), and an element $a_{i,j}$ in the check matrix is a $k_i \times n_j$ matrix; and the first submatrix is located on an upper side of the second submatrix, the first submatrix includes elements in first B rows and last B columns in the coding coefficient matrix, and the second submatrix includes elements in last (T−B) rows and the last B columns in the coding coefficient matrix.

The first submatrix includes B×B elements, each element is a matrix, B elements on a diagonal of the first submatrix are non-zero matrices, remaining elements are zero matrices, and the first submatrix includes the element $a_{i,j}$ in the coding coefficient matrix, where i=1, 2, . . . , B, j=(T+1), (T+2), . . . , (T+B), and an element $a_{i,j}$ in the B elements includes $k_i$ rows and $n_j$ columns and includes $k_i \times n_j$ coding coefficients.

It may be understood that, at the transmitting end, in one time of encoding, coding coefficients corresponding to the $i^{th}$ first data block in the T first data blocks are coding coefficients in row i in a column in the coding coefficient matrix. Therefore, i may be used for describing a data block in the T first data blocks.

Elements in the second submatrix and elements in last (T−B) rows and last (T−B) columns in the first matrix constitute a second matrix whose size is (T−B)×B, the second matrix is a generator matrix of a system MDS code, the second submatrix is a check part of the generator matrix, the second submatrix includes (T−B) rows and B columns, and the second submatrix includes the element $a_{i,j}$ in the coding coefficient matrix, where i=(B+1), (B+2), . . . , T, j=(T+1), (T+2), . . . , (T+B), and an element $a_{i,j}$ in the second submatrix includes $k_i \times n_j$ coding coefficients.

Figure 4:
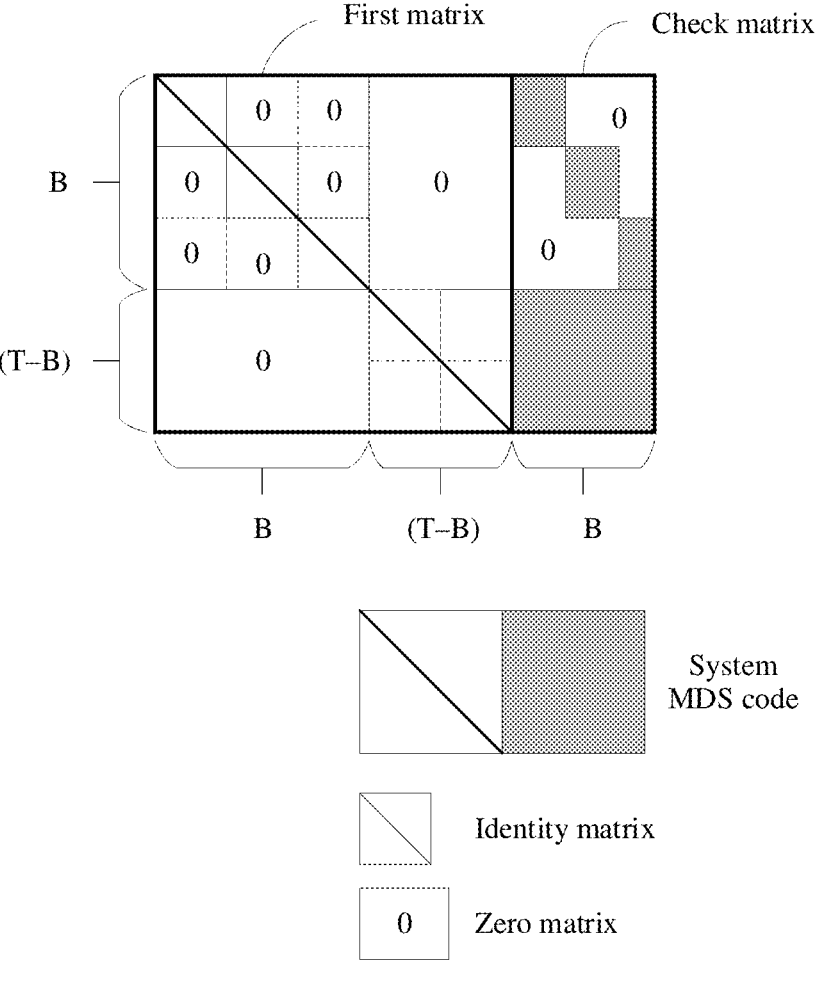
FIG. 4 is a schematic diagram of a coding coefficient matrix in Solution 1 according to this application.

FIG. 4 is a schematic diagram of a coding coefficient matrix in Solution 1 according to this application. As shown in FIG. 4, the coding coefficient matrix includes a first matrix whose size is T×T and a check matrix whose size is T×B. Elements on a diagonal of the first matrix are all identity matrices, and elements at remaining positions are all zero matrices. The check matrix includes a first submatrix located on an upper side and a second submatrix located on a lower side. Elements on a diagonal of the first submatrix are non-zero matrices, and elements at remaining positions are zero matrices. Elements in the second submatrix are all non-zero matrices. An element in row i and column j in the coding coefficient matrix is denoted as $a_{i,j}$, 1≤i≤T, 1≤j≤(T+B), and j is an integer. In this application, $a_{i,j}$ and $a_{i,j}$ are usually interchanged, and both represent the element in row i and column j in the coding coefficient matrix, where 1≤i≤T, 1≤j≤(T+B), and i and j are both integers.

Figure 5:
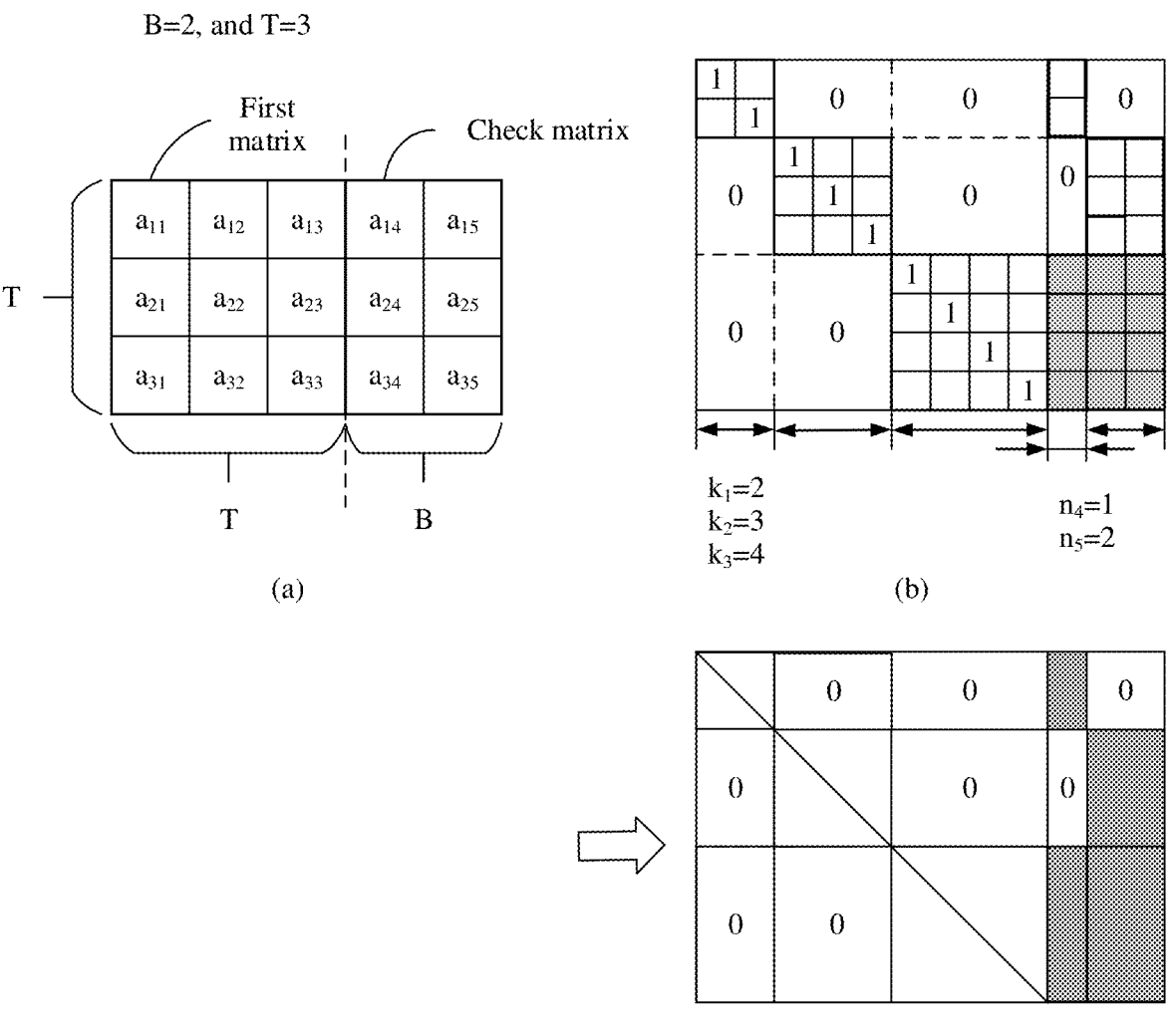
FIG. 5 shows an example of the coding coefficient matrix in Solution 1.

For ease of understanding, the following describes the coding coefficient matrix by using an example with reference to FIG. 5.

FIG. 5 shows an example of the coding coefficient matrix in Solution 1. In FIG. 5, it is assumed that B=2 and T=3. There are three first data blocks (that is, original data blocks) and B encoded data blocks in total. Further, it is assumed that quantities of original data packets included in the three first data blocks are 2, 3, and 4 respectively.

As described in step 310 above, the quantity of original data packets included in the $i^{th}$ first data block in the T first data blocks is $k_i$. In this case, a quantity $k_1$ of original data packets in a $1^{st}$ first data block in the three first data blocks is 2, a quantity $k_2$ of original data packets in a $2^{nd}$ first data block is 3, and a quantity $k_3$ of original data packets in a $3^{rd}$ first data block is 4.

In addition, a quantity of encoded data packets included in an $i^{th}$ encoded data block in the B encoded data blocks is $n_j$, where 1≤i≤B. In this application, the $i^{th}$ encoded data block in the B encoded data blocks is also a $j^{th}$ second data block in (T+B) second data blocks, where j=i+T, and i and j are both positive integers. For example, in the example in FIG. 5, B=2, T=3, a $1^{st}$ encoded data block is also a $4^{th}$ (that is, j=i+T=1+3=4) data block in the (T+B) second data blocks, and a $2^{nd}$ encoded data block is also a $5^{th}$ (that is, j=i+T=2+3=5) data block in the (T+B) second data blocks. Further, $n_j$ represents the quantity of encoded data packets in the $i^{th}$ encoded data block in the B encoded data blocks. In the example in FIG. 5, there are two encoded data blocks in total. A $1^{st}$ encoded data block is also a $4^{th}$ data block in five data blocks obtained through encoding, and a quantity of included encoded data packets may be represented as $n_j = n_4 = 1$. A $2^{nd}$ encoded data block is also a $5^{th}$ data block in the five data blocks obtained through encoding, and a quantity of included encoded data packets may be represented as $n_j = n_5 = 2$.

Based on this assumption, the size of the coding coefficient matrix is T rows by (T+B) columns. In this case, the coding coefficient matrix has a size of 3 rows by 5 columns, and includes 15 elements in total. An element in row i and column j is denoted as $a_{i,j}$, 1≤i≤3, 1≤j≤5, and i and j are both integers. For details, refer to (a) in FIG. 5.

Each element in the coding coefficient matrix is a matrix, and expansion of the coding coefficient matrix is shown in (b) in FIG. 5. It can be learned that there are three elements $a_{11}$, $a_{22}$, and $a_{33}$ in total on the diagonal of the coding coefficient matrix, the three elements are all identity matrices, and elements at remaining positions are all zero matrices.

The check matrix in the coding coefficient matrix includes a first submatrix whose size is 2×2 and a second submatrix whose size is 1×2. Elements on a diagonal of the first submatrix are non-zero matrices, and elements at remaining positions are zero matrices. An element $a_{i,j}$ in row i and column j in the check matrix is a $k_i \times n_j$ matrix. $k_i$ represents a quantity of original data packets included in an $i^{th}$ first data block in first B first data blocks in the T first data blocks, and $n_j$ represents the quantity of encoded data packets included in the $i^{th}$ encoded data block in the B encoded data blocks, that is, a quantity of encoded data packets included in an $(i+T)^{th}$ data block, where 1≤i≤3, and j=i+T. It should be noted that, when a quantity of encoded data packets in last B encoded data blocks is represented, a value of i is 1, 2, . . . , B, and j=i+T. Therefore, there are a total of B values of j. In the example in FIG. 5, because B=2, there are two values of j, j=4, or j=5.

It can be learned from (b) in FIG. 5 that elements shown in (a) in FIG. 5 are shown in (c) in FIG. 5. Elements $a_{12}$, $a_{13}$, $a_{15}$, $a_{21}$, $a_{23}$, $a_{24}$, $a_{31}$, and $a_{32}$ are all zero matrices, $a_{14}$, $a_{25}$, $a_{34}$, and $a_{35}$ are all non-zero matrices, and remaining elements are identity matrices.

In addition, the second matrix constituted by the elements in the second submatrix in the check matrix and the elements in the last (T−B) rows and the last (T−B) columns in the first matrix is the system MDS code. Optionally, the second matrix may be a Cauchy matrix or a Vandermonde matrix.

Optionally, the second matrix may alternatively be a systematic random linear code, for example, systematic random linear network coding (RLNC).

320: The transmitting end encodes the original data packets in the T first data blocks by using the coding coefficients and respective bit rates of the first B first data blocks in the T first data blocks, to obtain (T+B) second data blocks.

First T second data blocks in the (T+B) second data blocks are the T first data blocks, last B second data blocks in the (T+B) second data blocks are the B encoded data blocks, and the quantity of encoded data packets in the $i^{th}$ encoded data block in the B encoded data blocks is related to the quantity of original data packets in the $i^{th}$ first data block in the first B first data blocks and a bit rate of the $i^{th}$ first data block. It should be understood that the $i^{th}$ encoded data block in the B encoded data blocks is a $j^{th}$ data block in the (T+B) second data blocks, where j=i+T.

The quantity of encoded data packets in the $i^{th}$ encoded data block in the B encoded data blocks, the quantity of original data packets in the $i^{th}$ first data block in the first B first data blocks, and the bit rate of the $i^{th}$ first data block satisfy a function relation in the following formula (1):

$$r_i = \frac{k_i}{k_i + n_j}, i = 1, 2, \ldots, T, j = i + T \tag{1}$$

$r_i$ represents the bit rate of the $i^{th}$ first data block in the first B first data blocks, $k_i$ represents the quantity of original data packets in the $i^{th}$ first data block in the first B first data blocks, $n_j$ represents the quantity of encoded data packets in the $i^{th}$ encoded data block in the B encoded data blocks, and "/" represents a division operation.

FIG. 5 is still used as an example. A bit rate of the $1^{st}$ first data block in the three first data blocks is $r_1=k_1/(k_1+n_{T+1})=k_1/(k_1+n_4)=\frac{2}{3}$, and a bit rate of the $2^{nd}$ first data block is $r_2=k_2/(k_2+n_{T+2})=k_2/(k_2+n_5)=\frac{3}{5}$.

It can be learned that, in a data transmission process, if an $i^{th}$ first data block in first B first data blocks in T first data blocks is incorrect, the transmitting end does not need to send encoded data packets whose quantity is equal to a quantity (that is, $k_i$) of original data packets included in the $i^{th}$ first data block, but sends $n_j$ encoded data packets based on a channel status and a packet loss status. Generally, if $n_j$ is less than $k_i$, it can be ensured that an incorrect original data packet in the $i^{th}$ first data block is recovered. Therefore, in comparison with the $k_i$ encoded data packets at the transmitting end, the technical solution of this application can reduce a quantity of encoded data packets (or referred to as redundant data packets), to release more radio resources to meet another requirement. This improves radio resource utilization, and optimizes performance of a communication system.

It should be noted that, based on a structure of the coding coefficient matrix provided in FIG. 4 of this application, when the original data packets in the T first data blocks are encoded, a first data packet vector constituted by the original data packets included in the T first data blocks should be left-multiplied by the coding coefficient matrix. According to the foregoing description, the quantity of original data packets included in the $i^{th}$ first data block in the T first data blocks is $k_i$, and in this case, a total quantity K of original data packets included in the T first data blocks may be represented as $$K = \sum_{i=1}^{T} k_i;$$

and the quantity of encoded data packets included in the $j^{th}$ encoded data block in the B encoded data blocks is $n_j$, and in this case, a total quantity Z of encoded data packets included in the B encoded data blocks may be represented as $$Z = \sum_{j=1}^{B} n_j.$$

It is assumed that the first data packet vector is represented as $D_{1\times K}$. It can be learned that the coding coefficient matrix may be denoted as $A_{K\times(K+Z)}$. In this case, a process in which the transmitting end encodes the original data packets in the T first data blocks by using the coding coefficients is a matrix multiplication process of left-multiplying the first data packet vector by the coding coefficient matrix. For details, refer to the following formula:

$$W_{1\times(K+Z)}=D_{1\times K}\cdot A_{K\times(K+Z)}$$

W represents a second data packet vector constituted by data packets included in the (T+B) second data blocks.

It can be learned that the first data packet vector and the second data packet vector each are a row vector.

It should be specially noted that the size of the coding coefficient matrix in Solution 1 is described as T rows and (T+B) columns in some other places, that is, the coding coefficient matrix includes T×(T+B) elements in total. However, herein, the coding coefficient matrix is represented as $A_{K\times(K+Z)}$, and the two are actually equivalent. It should be understood that, when a coding coefficient matrix A is described as $A_{K\times(K+Z)}$, a quantity of elements in the coding coefficient matrix A is described by using coding coefficients, that is, the coding coefficient matrix A includes K×(K+Z) coding coefficients in total. When a coding coefficient matrix A is described as $A_{T\times(T+B)}$, a quantity of elements in the coding coefficient matrix A is described by using matrices, that is, the coding coefficient matrix includes T×(T+B) submatrices in total, and each submatrix includes a specific quantity of coding coefficients.

Therefore, equivalently, an encoding process in Solution 1 may alternatively be represented as:

$$W_{1\times(T+B)}=D_{1\times T}\cdot A_{T\times(T+B)}$$

It may be understood that, according to a matrix operation principle, that the first data packet vector is left-multiplied by the coding coefficient matrix may alternatively be equivalently described as that a transpose of the coding coefficient matrix is left-multiplied by a column vector (that is, a transpose of the first data packet vector, which is denoted as a first column vector below) constituted by the original data packets included in the T first data blocks, to obtain a column vector (that is, a transpose of the second data packet vector, which is denoted as a second column vector below) constituted by the data packets included in the (T+B) second data blocks.

The first column vector is represented as $D_{K\times1}$, and the second column vector is represented as $W_{(K+Z)\times1}$. In this case, step 320 may alternatively be equivalently represented as:

$$W_{(K+Z)\times1}=A_{(K+Z)\times K}\cdot D_{K\times1}$$

Alternatively, step 320 is equivalently represented as:

$$W_{(T+B)\times1}=A_{(T+B)\times T}\cdot D_{T\times1}$$

A matrix transposition operation is common sense. To avoid repetition, details are not described in this specification.

The coding coefficients in the coding coefficient matrix above may be selected from a finite field (for example, a Galois field).

330: The transmitting end sends the (T+B) second data blocks.

Optionally, different second data blocks in the (T+B) second data blocks are transmitted in different time units, and one time unit includes one or more slots, or one time unit includes one or more symbols. Alternatively, one time unit may include one slot, one symbol, a plurality of slots, or a plurality of symbols.

For example, FIG. 5 shows (T+B) time units.

In this application, T represents a quantity of time units of a maximum latency allowed for transmitting the original data packet, T is greater than or equal to B, and T and B are both positive integers. In other words, one original data packet can be correctly recovered within the maximum latency.

In addition, B is variable or adjustable.

For example, B may be adjusted based on a channel condition, to improve radio resource utilization. For example, if the channel condition is relatively good, B may be appropriately adjusted to a relatively small value, to release more radio resources for other purposes. If the channel condition is relatively poor, B may be appropriately adjusted to a relatively large value, to increase a decoding success probability at a receiving end.

In step 330, the receiving end receives the (T+B) second data blocks.

It can be learned from step 320 that first T second data blocks in the (T+B) second data blocks are the T first data blocks, last B second data blocks in the (T+B) second data blocks are the B encoded data blocks, and the quantity of encoded data packets in the $i^{th}$ encoded data block in the B encoded data blocks is related to the quantity of original data packets in the $i^{th}$ first data block in the first B first data blocks and the bit rate of the $i^{th}$ first data block.

340: The receiving end decodes (also referred to as performs decoding on) correctly received data packets in the (T+B) second data blocks, to obtain all data packets included in the T first data block.

A quantity $W_j$ of incorrect data packets in a $j^{th}$ second data block in first B second data blocks in the second data blocks received by the receiving end is not greater than a quantity $M_{j+T}$ of correctly received data packets in a $(j+T)^{th}$ second data block in the second data blocks received by the receiving end, and a total quantity $$\sum_1^T W_j$$

of incorrect data packets in the first T second data blocks in the second data blocks received by the receiving end is not greater than a total quantity $$\sum_{j=T+1}^{T+B} M_j$$

of correctly received data packets in the last B second data blocks in the second data blocks received by the receiving end, where $M_j$ represents a quantity of correctly received data packets in a $j^{th}$ second data block in the (T+B) second data blocks. That is, j represents the $j^{th}$ second data block in the (T+B) second data blocks received by the receiving end.

It may be understood that the receiving end does not need to receive all the data packets in the (T+B) second data blocks to start decoding, but may sequentially perform decoding from a $(T+1)^{th}$ second data block based on an encoded data packet in a $(T+m)^{th}$ second data block in combination with an $m^{th}$ second data block, to recover an original data packet in an $m^{th}$ first data block, where m=1, 2, . . . , B.

The $i^{th}$ first data block in the T first data blocks includes $k_i$ original data packets, 1≤i≤T, and T, B, $k_i$, and i are all positive integers.

For the receiving end, the data packet in the T first data blocks and the data packet in the (T+B) second data blocks satisfy the foregoing relationship of the coding coefficient matrix. Details are not described herein again. For details, refer to the description in step 310.

It may be understood that, at the receiving end, coding coefficients corresponding to the $j^{th}$ second data block in the (T+B) second data blocks are coding coefficients in column j in the coding coefficient matrix. Therefore, j may be used for describing a data block in the (T+B) second data blocks. Because data packets in the first T second data blocks correspond to system packets in the first T first data blocks, the first T second data blocks may alternatively be described from a perspective of the transmitting end, that is, i is used for description.

According to the data sending method provided in FIG. 3, it can be ensured that a maximum of B consecutive burst errors are recovered in T time units.

From another perspective, the process in which the transmitting end encodes the original data packets in the T first data blocks by using the coding coefficients in the coding coefficient matrix may alternatively be equivalently described as the following processing process in FIG. 6.

FIG. 6 is a schematic diagram of equivalent processing of a network coding process in Solution 1 according to this application.

510: A transmitting end obtains T first data blocks.

An $i^{th}$ first data block in the T first data blocks includes $k_i$ original data packets, 1≤i≤T, and T, $k_i$, and i are all positive integers.

520: The transmitting end encodes original data packets in first B first data blocks in the T first data blocks, to obtain B first encoded data blocks; and encodes original data packets in last (T−B) first data blocks in the T first data blocks, to obtain B second encoded data blocks.

A quantity of encoded data packets in an $i^{th}$ first encoded data block in the B first encoded data blocks is equal to a quantity of encoded data packets in an $i^{th}$ second encoded data block in the B second encoded data blocks.

530: The transmitting end performs, in a finite field, addition on encoded data packets in the B first encoded data blocks and encoded data packets in the B second encoded data blocks, to obtain B third encoded data blocks.

An addition operation is sequentially and correspondingly performed, in a finite field, on the encoded data packets in the $i^{th}$ first encoded data block in the B first encoded data blocks and the encoded data packets in the $i^{th}$ second encoded data block in the B second encoded data blocks, to obtain the B third encoded data blocks.

An $i^{th}$ third encoded data block in the B third encoded data blocks includes $n_j$ encoded data packets, 1≤i≤B, j=i+T, $n_j$ is less than $k_i$, and T, $n_j$, and j are all positive integers.

In addition, a quantity of encoded data packets in the $i^{th}$ encoded data block in the B third encoded data blocks is related to a quantity $k_i$ of original data packets in an $i^{th}$ first data block in the first B first data blocks and a bit rate of the $i^{th}$ first data block.

In an implementation, a quantity of encoded data packets in an $i^{th}$ encoded data block in B encoded data blocks, the quantity $k_i$ of original data packets in the $i^{th}$ first data block in the first B first data blocks, and the bit rate of the $i^{th}$ first data block satisfy the following function relation:

$$r_i = k_i/(k_i + n_j), \text{ where } i=1,2, \ldots ,B, \text{ and } j=i+T.$$

$r_i$ represents the bit rate of the $i^{th}$ first data block in the first B first data blocks, $k_i$ represents the quantity of original data packets in the $i^{th}$ first data block in the first B first data blocks, $n_j$ represents the quantity of encoded data packets in the $i^{th}$ encoded data block in the B third encoded data blocks, and "/" represents a division operation.

540: The transmitting end sends the T first data blocks and the B third encoded data blocks.

It should be noted that numbers "first", "second", and "third" of data blocks or encoded blocks in FIG. 6 are merely used to distinguish between different data blocks or encoded blocks in FIG. 6. For example, the second encoded data block in FIG. 6 is irrelevant to a second encoded data block in FIG. 3.

Figure 7:
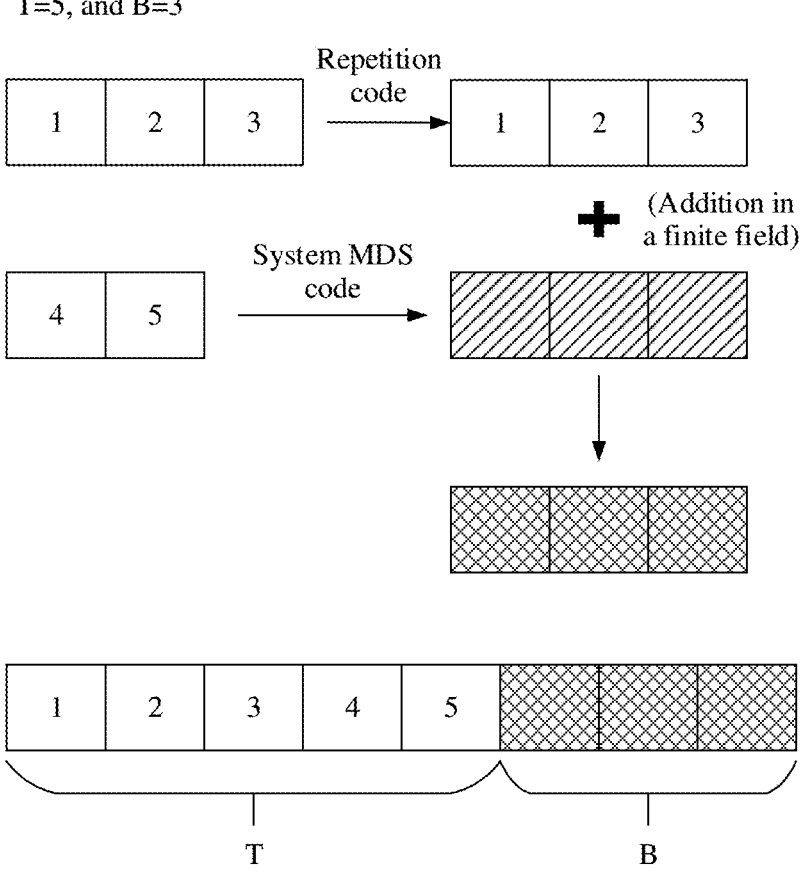
FIG. 7 shows an example of equivalent processing performed by a transmitting end in Solution 1 according to this application.

With reference to FIG. 7, the following uses an example to describe the network coding process described in FIG. 6.

FIG. 7 shows an example of equivalent processing performed by the transmitting end in Solution 1 according to this application. In FIG. 7, it is assumed that T=5 and B=3. In this case, there are five first data blocks in total. It is assumed that each first data block has only one original data packet, that is, $k_i=1$, and $1 \le i \le 5$. As shown in FIG. 7, the transmitting end encodes first three original data packets in five original data packets by using a repetition code, to obtain three first encoded data packets. Because the repetition code is used, the three first encoded data packets are the first three original data packets in the five original data packets. The transmitting end encodes last two original data packets in the five original data packets by using a system MDS code, to obtain three second encoded data packets. Further, the transmitting end performs, in a finite field, addition on the three first encoded data packets and the three second encoded data packets, to obtain three third encoded data packets. Alternatively, addition in the finite field or an exclusive OR (XOR) operation is performed. The transmitting end sequentially and correspondingly performs, in the finite field, the addition operation on the three first encoded data packets and the three second encoded data packets, to obtain the three third encoded data packets. The transmitting end sends the five original data packets and the three third encoded data packets.

Solution 2

A difference from a design concept of Solution 1 lies in that, in Solution 2, different redundancy versions (RVs) are introduced for original data packets in T original data blocks, and different redundancy versions of the original data packets are encoded. A receiving end recovers an original data packet in an incorrect original data block by combining soft information of different redundant versions of an original data packet. In this way, decoding is enhanced, to improve a decoding success probability.

In addition, Solution 2 can also meet a requirement of a communication system for a low latency. For an original data packet in each original data block, a maximum decoding latency is T.

It should be understood that, when each original data block in the T original data blocks includes one data packet, Solution 2 is also applicable.

Figure 8:
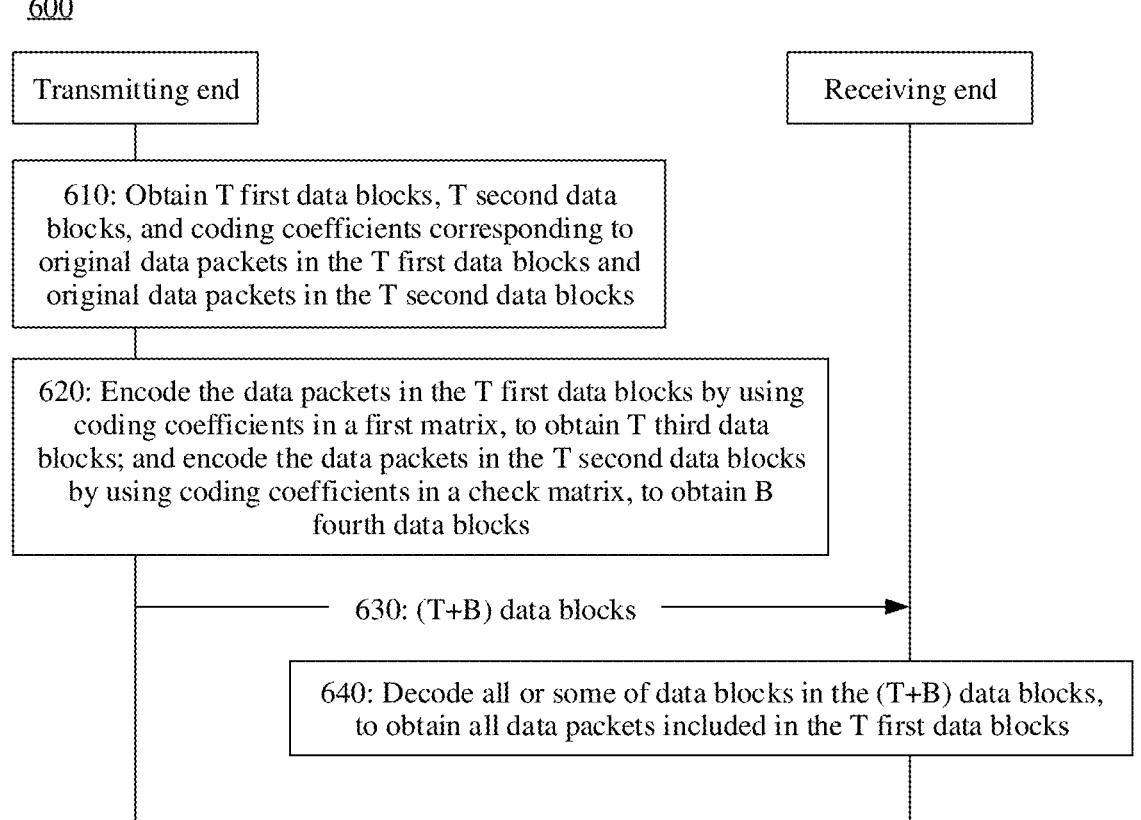
FIG. 8 is a schematic flowchart of another data sending and data receiving method according to this application.

The following provides a description with reference to FIG. 8.

FIG. 8 is a schematic flowchart of another data sending and data receiving method according to this application.

610: A transmitting end obtains T first data blocks, T second data blocks, and coding coefficients corresponding to the T first data blocks and the T second data blocks.

An $i^{th}$ first data block in the T first data blocks and an $i^{th}$ second data block in the T second data blocks each include $k_i$ original data packets, versions of original data packets included in the T first data blocks are first redundancy versions, versions of original data packets included in first B second data blocks in the T second data blocks are second redundancy versions, and versions of original data packets in last (T−B) second data blocks in the T second data blocks are the first redundancy versions.

The coding coefficients satisfy the following coding coefficient matrix:

A size of the coding coefficient matrix is T rows by (T+B) columns, the coding coefficient matrix includes a first matrix whose size is T rows by T columns and a check matrix whose size is T rows by B columns, and the first matrix is located on a left side of the check matrix.

The first matrix is a T×T identity matrix.

The check matrix includes a first submatrix whose size is B×B and a second submatrix whose size is (T−B)×B.

The first submatrix is an identity matrix, the second submatrix and last (T−B) rows and last (T−B) columns in the first matrix constitute a second matrix whose size is (T−B)×B, the second matrix is a generator matrix of a system MDS code, and the second submatrix is a check part of the generator matrix.

Figure 9:
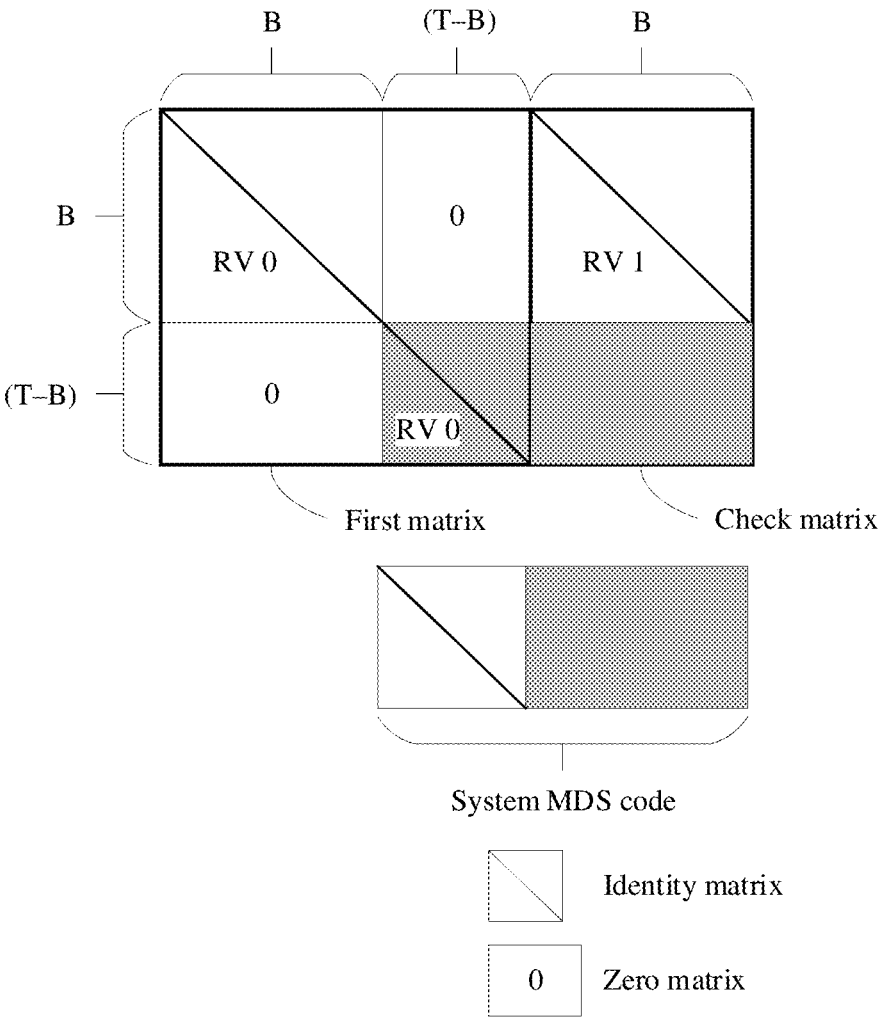
FIG. 9 is a schematic diagram of a coding coefficient matrix in Solution 2 according to this application.

FIG. 9 is a schematic diagram of a coding coefficient matrix in Solution 2 according to this application. As shown in FIG. 9, the coding coefficient matrix includes a first matrix whose size is T×T and a check matrix whose size is T×B. The first matrix is an identity matrix. The check matrix includes a first submatrix located on an upper side and a second submatrix located on a lower side. The first submatrix is an identity matrix whose size is B×B. B elements on a diagonal of the first submatrix are all identity matrices, and elements at remaining positions are zero matrices. Elements in the second submatrix are all non-zero matrices. The elements in the second submatrix and elements in last (T−B) rows and last (T−B) columns in the first matrix constitute a second matrix whose size is (T−B)×B, and the second matrix is a generator matrix of a system MDS code. Optionally, the second matrix may be a Cauchy matrix or a Vandermonde matrix. This is not limited. In addition, optionally, the second matrix may alternatively be a systematic random linear code, for example, systematic random linear network coding (RLNC).

It should be noted that an RV 0 and an RV 1 that are denoted in the coding coefficient matrix in FIG. 9 represent numbers of redundancy versions used for an original data packet vector multiplied by the part in the coding coefficient matrix, and are irrelevant to the coding coefficient matrix.

Figure 10:
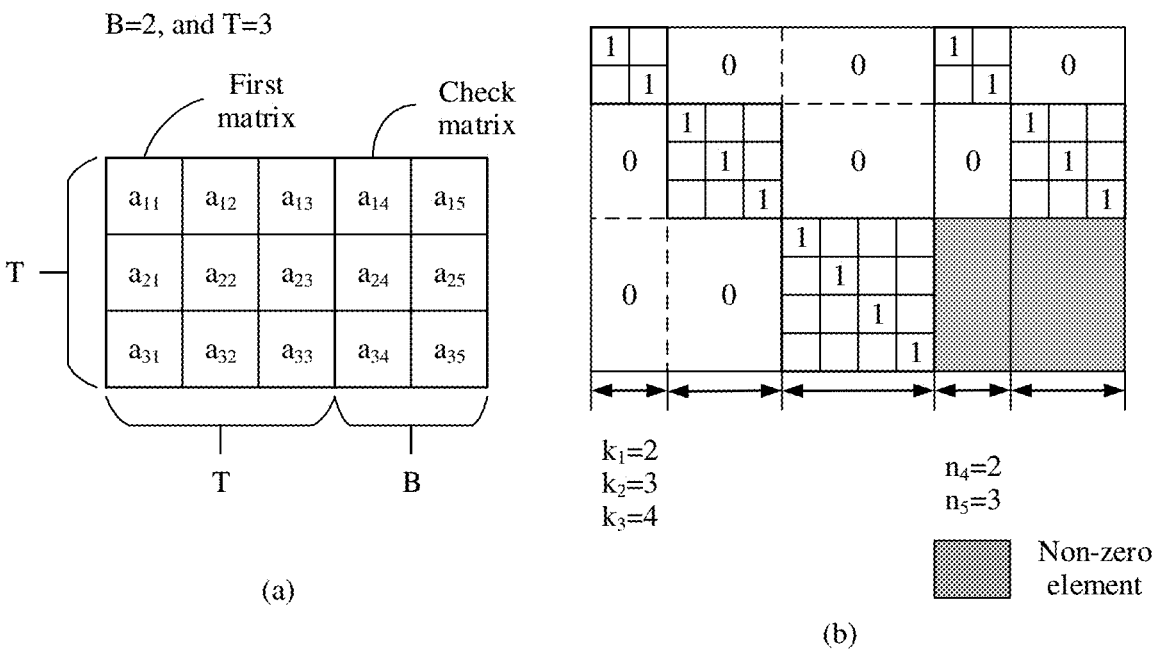
FIG. 10 shows an example of the coding coefficient matrix in Solution 2.

With reference to FIG. 10, the following uses an example to describe the coding coefficient matrix in FIG. 9.

FIG. 10 shows an example of the coding coefficient matrix in Solution 2. In FIG. 10, it is assumed that B=2 and T=3. Therefore, the coding coefficient matrix has 15 elements in total, as shown in (a) in FIG. 10. The first matrix in the coding coefficient matrix is an identity matrix. Elements $a_{11}$, $a_{22}$, and $a_{33}$ in the foregoing 15 elements are identity matrices. Elements on a diagonal in the first submatrix are also identity matrices. Elements $a_{14}$ and $a_{25}$ are identity matrices. In addition, $a_{12}$, $a_{13}$, $a_{15}$, $a_{21}$, $a_{23}$, $a_{24}$, $a_{31}$, and $a_{32}$ are all zero matrices, and $a_{34}$ and $a_{35}$ are both non-zero matrices (also referred to as non-identity matrices).

It can be found that, in Solution 1, the quantity of encoded data packets included in the $i^{th}$ encoded data block in the B encoded data blocks is $n_j$, where $n_j$ is less than or equal to $k_i$, $1 \le i \le B$, and j=i+T. To reduce a quantity of encoded data packets, when it can be ensured that an original data packet in the $i^{th}$ first data block is correctly decoded, a smaller quantity $n_j$ of encoded data packets included in the $i^{th}$ encoded data block is better, because the smaller $n_j$ indicates a lower redundancy degree of the encoded data packet.

However, a difference from Solution 1 lies in that, in Solution 2, a quantity of encoded data packets included in an $i^{th}$ encoded data block in B encoded data blocks is equal to a quantity of original data packets included in an $i^{th}$ first data block in first B first data blocks in the T first data blocks, that is, $n_j=k_i$, and $1 \le i \le B$.

In the example in FIG. 10, there are two encoded data blocks in total. A quantity of encoded data packets included in a $1^{st}$ encoded data block is $n_4=k_1=2$, and a quantity of encoded data packets included in a $2^{nd}$ encoded data block is $n_5=k_2=3$.

In addition, a redundancy version of an original data packet in Solution 2 is described.

Figure 11:
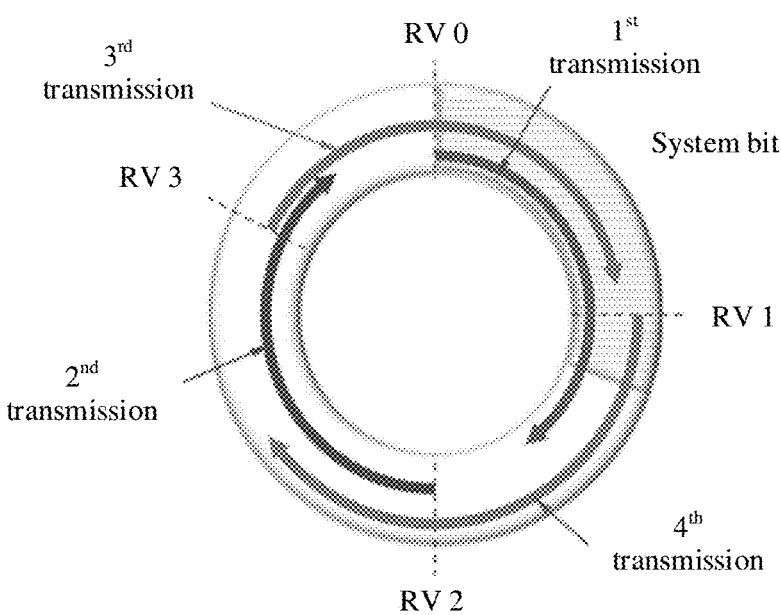
FIG. 11 is a schematic diagram of a redundancy version.

According to the communication protocol 38.212, different redundancy versions may be generated for several information bits in a manner of low-density parity-check (LDPC) channel coding, as shown in FIG. 11.

FIG. 11 is a schematic diagram of a redundancy version. FIG. 11 shows four redundancy versions: an RV 0 to an RV 3, where the RV 0 represents a system bit (or referred to as an information bit). The transmitting end may perform sending in a sequence of the RV 0, the RV 2, the RV 3, and the RV 1. Data sizes corresponding to different redundancy versions are the same. A receiving end may perform joint decoding on different redundancy versions. The RV 1 to the RV 3 are all check bits generated by encoding system bits. Therefore, if the RV 0 is incorrect, the receiving end can obtain a correct RV 0 through recovery based on the incorrect RV 0 in combination with the received RV 1 to RV 3.

In Solution 2, a first redundancy version of each original data packet may be equivalent to the RV 0. When a bit rate is 1, the RV 0 to the RV 3 have no data overlapping. The transmitting end generates a second redundancy version of the original data packet, for example, the RV 1, according to a method for generating an RV through LDPC coding that is described in FIG. 11. A size of an original data packet corresponding to the RV 0 is equal to a size of an original data packet corresponding to the RV 1.

With reference to the network coding method described in FIG. 8, it can be learned that, in Solution 2, the transmitting end uses first redundancy versions for the original data packets included in the T first data blocks, uses second redundancy versions for the original data packets in the first B second data blocks in the T second data blocks, and uses the first redundancy versions for the original data packets in the last (T−B) second data blocks in the T second data blocks, where the first redundancy version is different from the second redundancy version.

620: The transmitting end encodes the data packets in the T first data blocks by using coding coefficients in the first matrix, to obtain T third data blocks; and encodes the data packets in the T second data blocks by using coding coefficients in the check matrix, to obtain B fourth data blocks.

The T third data blocks are the T first data blocks, the B fourth data blocks are the B encoded data blocks, each encoded data block includes one or more encoded data packets, and the quantity of data packets in the $i^{th}$ encoded data block in the B encoded data blocks is equal to the quantity of data packets in the $i^{th}$ first data block in the first B first data blocks in the T first data blocks.

630: The transmitting end sends the T third data blocks and the B fourth data blocks.

The receiving end receives (T+B) data blocks from transmitting end.

First T data blocks in the (T+B) data blocks are the T third data blocks, and last B data blocks in the (T+B) data blocks are the B fourth data blocks. The T third data blocks correspond to the T first data blocks, and the B fourth data blocks are the B encoded data blocks.

640: The receiving end decodes all or a part of data blocks in the (T+B) data blocks, to obtain all data packets included in the T first data blocks.

In Solution 2, during network coding, two different redundancy versions are introduced for an original data packet. The receiving end recovers an incorrect original data packet by combining soft information of different redundant versions. In this way, a decoding success probability is increased, and decoding is enhanced.

It should be noted that a process in which the transmitting end encodes the data packets in the T first data blocks and the data packets in the T second data blocks by using the coding coefficient matrix shown in FIG. 8 may alternatively be equivalently described as the following processing process in FIG. 12.

FIG. 12 is a schematic diagram of equivalent processing of a network coding process in Solution 2 according to this application. In FIG. 12, an example in which each of the T first data blocks includes one original data packet and each of the T second data blocks includes one original data packet is used for description.

810: The transmitting end obtains T original data packets, where first redundancy versions are used for the T original data packets.

820: The transmitting end encodes first redundancy versions of last (T−B) original data packets in the T original data packets, to obtain B first encoded data packets.

830: The transmitting end performs, in a finite field, addition on the B first encoded data packets and second redundancy versions of first B original data packets in the T original data packets, to obtain B second encoded data packets.

840: The transmitting end sends the T original data packets and the B second encoded data packets.

The following provides a description by using an example with reference to FIG. 13.

FIG. 13 shows an example of equivalent processing performed by the transmitting end in Solution 2. It is assumed that T=4 and B=2. There are four original data packets in total. The four original data packets are respectively denoted as P1 to P4, and a version of each of P1 to P4 is a first redundancy version, denoted as an RV 0. The transmitting end performs system MDS coding on the RV 0 of P3 and the RV 0 of P4, to obtain two encoded data packets, for example, C1' and C2' shown in FIG. 13. The transmitting end performs XOR coding on RVs 1 of first two original data packets (i.e., P1 and P2) and C1' and C2' respectively, to obtain encoded data packets C1 and C2. The transmitting end sends the RVs 0 of P1 to P4 and C1 and C2.

In comparison with a conventional MS code solution that supports correction of a maximum of B contiguous incorrect data blocks, Solution 2 provided in this application breaks a limitation of correction of a maximum of B contiguous incorrect data blocks. When (T−B) data packets participating in system MDS coding are correct, there is no requirement on correctness and incorrectness of the other 2B data packets. In other words, in this case, joint decoding may be performed on two RVs of an incorrect data packet in Solution 2, so that correction of more than B contiguous incorrect data blocks is supported.

In FIG. 13, a data packet is used as an example to describe Solution 2, and a data block is also applicable. When all data packets in (T−B) data blocks participating in system MDS coding are correct, there is no requirement on correctness and incorrectness of data packets in first B original data blocks and last B encoded data blocks (that is, 2B data blocks in total). In this case, joint decoding may be performed on two RVs of an incorrect data packet in Solution 2, so that correction of more than B contiguous incorrect data blocks is still supported.

In one case, it is assumed that each data block has only one data packet. If first B data packets are incorrect, a $(B+1)^{th}$ data packet to a $T^{th}$ data packet are correct, and a $(T+1)^{th}$ encoded data packet is incorrect, after elimination is performed on the $(T+1)^{th}$ encoded data packet based on the $(B+1)^{th}$ original data packet to the $T^{th}$ original data packet, only another RV of a $1^{st}$ data packet, for example, an RV 1, is left, and soft decoding is performed in combination with an RV 0 and the RV 1 of the $1^{st}$ data packet. In this way, there is a high probability that the $1^{st}$ original data packet can be recovered.

It should be understood that, this solution is also applicable to a case in which one data block has a plurality of data packets. In this case, the $(B+1)^{th}$ data block to the $T^{th}$ data block all need to be correct. Soft decoding is performed on an incorrect data packet in an incorrect data block through combination of different RVs, so that a probability of successfully decoding the incorrect data packet can be increased.

In another case, if Q data blocks in (T−B) data blocks participating in system MDS coding are incorrect, but Q is less than B, and the Q incorrect data blocks are any Q of any B contiguous data blocks in (T+B) data blocks, Solution 2 still supports correction of a maximum of B contiguous incorrect data blocks. In other words, the transmitting end sends (T+B) data blocks, where the (T+B) data blocks includes first T original data blocks and B encoded data blocks. If Q data blocks in B contiguous data blocks starting from a data block at any position in the (T+B) data blocks are incorrect, and the Q incorrect data blocks may be any Q of the B contiguous data blocks, for example, Q contiguous data blocks or Q random data blocks, a maximum of B contiguous incorrect data blocks can be corrected in Solution 2. This improves error correction performance of a communication system.

The following describes a decoding process on a decoder side in Solution 2.

FIG. 14 is a schematic diagram of a decoding procedure of a receiving end in Solution 2 according to this application.

910: The receiving end receives (T+B) data blocks from a transmitting end.

First T data blocks in the (T+B) data blocks are T third data blocks, and last B data blocks in the (T+B) data blocks are B fourth data blocks. The T third data blocks correspond to T first data blocks, the B fourth data blocks are B encoded data blocks, each encoded data block in the B encoded data blocks includes one or more encoded data packets, and a quantity of data packets in an $i^{th}$ encoded data block in the B encoded data blocks is equal to a quantity of data packets in an $i^{th}$ first data block in first B first data blocks in the T first data blocks, where T and B are both positive integers.

In addition, a relationship between the T third data blocks and the T first data blocks satisfies the first matrix in the coding coefficient matrix described in FIG. 9 or FIG. 10, and a relationship between the B fourth data blocks and T second data blocks satisfies the check matrix in the coding coefficient matrix described in FIG. 9 or FIG. 10. Versions of all data packets included in the T first data blocks are first redundancy versions of original data packets, versions of all data packets included in first B second data blocks in the T second data blocks are second redundancy versions of the original data packets, and all data packets in last (T−B) second data blocks in the T second data blocks are the first redundancy versions of the original data packets.

An $i^{th}$ first data block in the T first data blocks and an $i^{th}$ second data block in the T second data blocks each include $k_i$ original data packets, $1 \le i \le T$, and T, B, $k_i$, and i are all positive integers.

For ease of description, first B data blocks in the first T data blocks in the (T+B) data blocks constitute a first data block set, and remaining (T−B) data blocks in the first T data blocks constitute a second data block set.

920: The receiving end decodes a part or all of data blocks in the (T+B) data blocks, to obtain all the data packets included in the T first data blocks.

The receiving end determines a quantity Q and positions of incorrect data blocks in the (T+B) data blocks, and decodes all or some of data blocks in the (T+B) data blocks based on the quantity Q and positions of incorrect data blocks, to obtain all the data packets included in the T first data blocks, where Q is a nonnegative integer.

In this application, if at least one data packet in a data block is incorrect, the data block is referred to as an incorrect data block. If all data packets in a data block are correct, the data block is a correct data block.

In addition, a position of an incorrect data block is a position of the incorrect data block in the (T+B) data blocks.

In a possible case, if Q is greater than B, and the Q incorrect data blocks are any Q data blocks in B data blocks in the first data block set and the B fourth data blocks, the receiving end decodes the B fourth data blocks and data blocks that are in the first data block set. In this case, the receiving end can correct more than B contiguous incorrect data blocks.

Alternatively, in another possible case, if Q is greater than B, and one or more incorrect data blocks in the Q incorrect data blocks are B data blocks included in the second data block set, the receiving end skips performing decoding.

Alternatively, in another possible case, if Q is less than or equal to B, and the Q incorrect data blocks are any Q data blocks in B contiguous data blocks in the (T+B) data blocks, the receiving end decodes correct data blocks in the (T+B) data blocks.

Alternatively, if Q is less than or equal to B, and the Q incorrect data blocks are any Q data blocks in the (T+B) data blocks, the receiving end decodes all the data blocks in the (T+B) data blocks.

In this case, there is a relatively high probability that the receiving end can recover an incorrect original data packet by combining different RVs of an original data packet. Therefore, decoding may be performed, to improve a decoding success rate.

In step 920, the receiving end decodes all or the part of data blocks in the (T+B) data blocks. The receiving end may obtain different redundancy versions of data packets in all or the part of data blocks, and perform decoding and recovery on incorrect data packets in the Q incorrect data blocks by using the different redundancy versions of the data packets.

In the example in FIG. 14, a data block is used as an example. It is assumed that one data packet is sent in one time unit (for example, a slot or a symbol). In this case, the (T+B) data blocks in FIG. 14 are equivalent to (T+B) data packets.

FIG. 13 is still used as an example. The transmitting end sends six data packets to the receiving end. The six data packets include four original data packets P1 to P4 and two encoded data packets C1 and C2. When P3 and/or P4 received by the receiving end are/is incorrect, RVs 0 of correct P1 and P2 may be converted into RVs 1, and then elimination is separately performed on the encoded packets C1 and C2, to eliminate the RVs 1 of P1 and P2 to obtain encoded packets C1' and C2'. Further, the encoded packets C1' and C2' obtained after elimination are decoded, to obtain the original data packets P3 and P4. In this case, a maximum of two contiguous data packets are allowed to be incorrect.

When the original data packets P3 and P4 are correct, P1 and P2 and C1 and C2 may be all allowed to be incorrect in Solution 2.

In this case, the receiving end first performs elimination on the correct data packets P3 to P4 from the incorrect encoded packets C1 and C2, to obtain RVs 1 of the incorrect original data packets P1 and P2; performs joint decoding on an RV 0 and the RV 1 of each of P1 and P2; and recovers an incorrect bit by using a channel decoding capability, to obtain RVs 0 of correct original data packets P1 and P2.

It can be learned that, in Solution 2, another RV of an original data packet is introduced into an encoded data packet, so that decoding performance of the conventional MS code solution can be optimized. As long as it is ensured that (T−B) original data packets participating in system MDS coding are correct, in addition to B contiguous incorrect data blocks, B contiguous incorrect data blocks can be further corrected. When first B original data packets in (T+B) original data packets sent by the transmitting end are incorrect, and last B encoded data packets are incorrect, the receiving end may still recover the B original data packets that are incorrect. In this case, in addition to the B contiguous incorrect data blocks, Solution 2 can additionally resist any random errors whose quantity is less than or equal to B and that are in an encoded packet.

As described above, Solution 2 is also applicable to a data block. For (T+B) data blocks, if (T−B) original data blocks participating in system MDS coding are correct, more than B contiguous incorrect data blocks can be corrected. In an extreme case, when first B original data blocks and last B encoded data blocks are all incorrect, the receiving end may still recover original data packets in the first B original data blocks.

FIG. 13 describes an equivalent processing process of performing network coding by the transmitting end in Solution 2. Correspondingly, a process of receiving data by the receiving end may also be described by using a corresponding equivalent processing process. The corresponding equivalent processing process is as follows:

The receiving end receives T third data blocks and B fourth data blocks, where the T third data blocks are T first data blocks, the B fourth data blocks are B encoded data blocks, each encoded data block in the B encoded data blocks includes one or more encoded data packets, and a quantity of data packets in an $i^{th}$ encoded data block in the B encoded data blocks is equal to a quantity of data packets in an $i^{th}$ first data block in first B first data blocks in the T first data blocks.

The receiving end decodes all or a part of data blocks in the T third data blocks and the B fourth data blocks, to obtain all data packets included in the T first data blocks.

A relationship between the T third data blocks and the T first data blocks satisfies a first matrix in the following coding coefficient matrix, a relationship between the B fourth data blocks and T second data blocks satisfies a check matrix in the coding coefficient matrix, versions of all the data packets included in the T first data blocks are first redundancy versions of original data packets, versions of all data packets included in first B second data blocks in the T second data blocks are second redundancy versions of the original data packets, and all data packets in last (T−B) second data blocks in the T second data blocks are the first redundancy versions of the original data packets.

An $i^{th}$ first data block in the T first data blocks and an $i^{th}$ second data block in the T second data blocks each include $k_i$ original data packets, $1 \leq i \leq T$, and T, B, $k_i$, and i are all positive integers.

A size of the coding coefficient matrix is T rows by (T+B) columns, the coding coefficient matrix includes the first matrix whose size is T rows by T columns and the check matrix whose size is T rows by B columns, and the first matrix is located on a left side of the check matrix.

The first matrix includes T×T elements, each element is a matrix, T elements on a diagonal of the first matrix are all identity matrices, remaining elements are zero matrices, an $i^{th}$ element in the T elements includes $k_i \times k_i$ coding coefficients, and $1 \leq i \leq T$.

The check matrix includes a first submatrix whose size is B×B and a second submatrix whose size is (T−B)×B.

The first submatrix includes B×B elements, B elements on a diagonal of the first submatrix are all identity matrices, and remaining elements are zero matrices; and elements in the second submatrix and elements in last (T−B) rows and last (T−B) columns in the first matrix constitute a second matrix whose size is (T−B)×B, the second matrix is a generator matrix of a system maximum distance separable MDS code, and the second submatrix is a check part of the generator matrix.

In Solution 1, the coding coefficient matrix is designed, so that an original data packet can be recovered within a maximum latency allowed in a communication system. In Solution 2, different redundancy versions of an original data packet are introduced, so that a latency requirement of a communication system can also be met. The following further describes a solution, for example, Solution 3 in the following.

Solution 3

A design concept of Solution 3 is different from both the design concept of Solution 1 and the design concept of Solution 2, and three network coding schemes based on a maximum latency are involved.

For clarity and convenience of description, a basic solution is first provided, and is referred to as a sliding window network coding scheme based on a maximum latency below. In the sliding window network coding scheme based on a maximum latency, a transmitting end provides protection with a maximum latency of T for each original data block, for example, Solution (1) in the following.

On the basis of the sliding window network coding scheme based on a maximum latency, a convolutional network coding scheme may be further combined with the sliding window network coding scheme, to optimize performance of the sliding window network coding scheme based on a maximum latency, for example, Solution (2) in the following.

In addition, on the basis of the convolutional network coding scheme, feedback from a receiving end may be further introduced, to further enhance ensuring of a decoding latency, for example, Solution (3) in the following.

The following describes the solutions one by one.

(1) Sliding Window Network Coding Scheme Based on a Maximum Latency

In the sliding window network coding scheme based on a maximum latency, the transmitting end sends an $(i+T)^{th}$ data block, where the $(i+T)^{th}$ data block includes an original data packet and an encoded data packet, the encoded data packet is obtained by encoding the original data packet in the $(i+T)^{th}$ data block and an original data packet in an $i^{th}$ data block, and T represents a quantity of time units of a maximum latency allowed for the original data packet in the $i^{th}$ data block.

Figure 15:
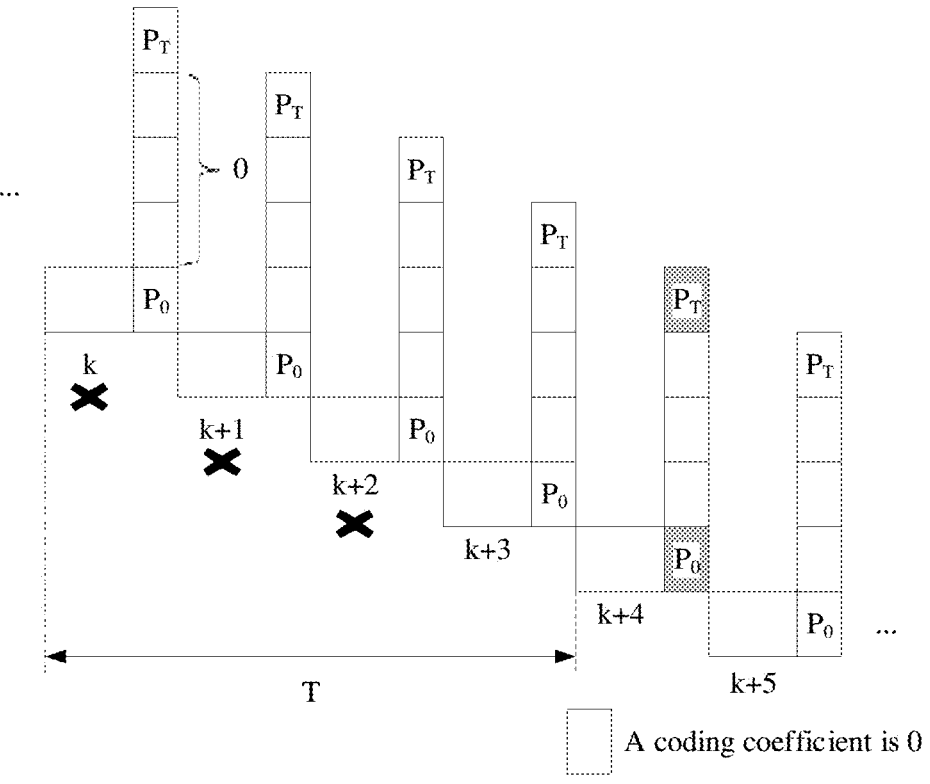
FIG. 15 is a schematic diagram of a data sending method according to this application.

The following provides a description with reference to FIG. 15.

FIG. 15 is a schematic diagram of still another data sending method according to this application. As shown in FIG. 15, a transmitting end provides protection with a maximum latency of T for each data block. In other words, if an $i^{th}$ data block is incorrect within a maximum latency time, a receiving end performs decoding and recovery on the $i^{th}$ data block by using an $(i+T)^{th}$ data block within the maximum latency T.

Correspondingly, at the transmitting end, the $(i+T)^{th}$ data block includes an original data packet and an encoded data packet, where the encoded data packet in the $(i+T)^{th}$ encoded data block is obtained by encoding an original data packet in the $i^{th}$ encoded data block and the original data packet in the $(i+T)^{th}$ data block.

As shown in FIG. 15, it is assumed that a $k^{th}$ data block received by the receiving end is incorrect, and a $(k+1)^{th}$ data block, a $(k+2)^{th}$ data block, and a $(k+3)^{th}$ data block are all incorrect. In this case, the receiving end may perform decoding and recovery on the original data packet in the $i^{th}$ data block by using an encoded data packet in a $(k+4)^{th}$ data block.

In FIG. 15, $P_0$ and $P_T$ each represent a non-zero coding coefficient, and remaining coding coefficients are 0. These coding coefficients may be coefficients of MDS codes, coefficients of random linear codes, or the like. This is not limited.

Further, on the basis of the foregoing sliding window network coding scheme based on a maximum latency, convolutional network coding is introduced, and the two are combined to obtain Solution (2).

(2) Combination of the Sliding Window Network Coding Scheme Based on a Maximum Latency and the Convolutional Network Coding Scheme (for Brevity of Description, Also Referred to As a Combination Solution Below)

In the combination solution, that the encoded data packet in the $(i+T)^{th}$ data block is obtained by encoding the original data packet in the $(i+T)^{th}$ data block and an original data packet in the $i^{th}$ data block includes:

The encoded data packet in the $(i+T)^{th}$ data block is obtained by encoding the original data packet in the $(i+T)^{th}$ data block, the original data packet in the $i^{th}$ data block, and an original data packet or original data packets in one or more data blocks between the $i^{th}$ data block and the $(i+T)^{th}$ data block.

Figure 16:
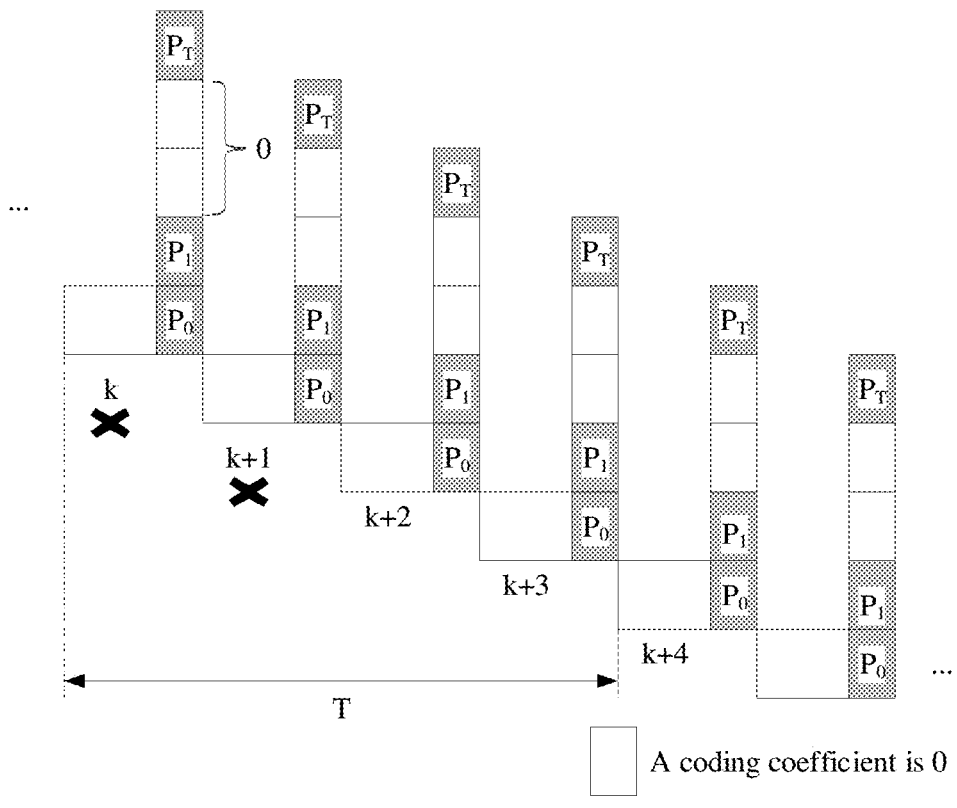
FIG. 16 is a schematic diagram of another data sending method according to this application.

The following provides a description with reference to FIG. 16.

FIG. 16 is a schematic diagram of yet another data sending method according to this application. As shown in FIG. 16, an $(i+T)^{th}$ data block includes an original data packet and an encoded data packet, and the encoded data packet included in the $(i+T)^{th}$ data block is obtained by encoding the original data packet in the $(i+T)^{th}$ data block, an original data packet in an $i^{th}$ data block, and an original data packet in an $(i+T-1)^{th}$ data block.

It should be understood that, in FIG. 16, an association depth of the $(i+T)^{th}$ data block is (T+1). Within a maximum latency T, the $(i+T)^{th}$ data block is associated with a $T^{th}$ data block located before the $(i+T)^{th}$ data block. In other words, that the association depth is (T+1) indicates that the encoded data packet in the $(i+T)^{th}$ data block is obtained by encoding the original data packet in the $(i+T)^{th}$ data block, the original data packet in the $i^{th}$ data block, and the original data packet in the $(i+T-1)^{th}$ data block, where the association depth is not greater than T+1. A $(k+4)^{th}$ data block is used as an example. An encoded data packet in the $(k+4)^{th}$ data block is obtained by encoding an original data packet in the $(k+4)^{th}$ data block, an original data packet in a $k^{th}$ data block, and an original data packet in a $(k+3)^{th}$ data block. $P_0$, $P_1$, and $P_T$ each represent a non-zero coding coefficient, and remaining coding coefficients are 0. These coding coefficients may be coefficients of MDS codes, coefficients of random linear codes, or the like. This is not limited. In addition, the encoded data packet in the $(i+T)^{th}$ data block may be obtained by encoding the original data packet in the $(i+T)^{th}$ data block, the original data packet in the $i^{th}$ data block, and original data packets in any quantity of data blocks between the $(i+T)^{th}$ data block and the $i^{th}$ data block.

Feedback from the receiving end is considered in neither the foregoing sliding window network coding scheme based on a maximum latency nor the solution of combining the sliding window network coding scheme and the convolutional network coding scheme. In this application, under a constraint of the maximum latency, after feedback from the receiving end is introduced, a network coding scheme can be further optimized, and Solution (3) in the following is provided.

(3) Convolutional Network Coding Scheme in which Feedback from a Receiving End is Introduced The convolutional network coding scheme using feedback is usually multi-process. In the multi-process network coding scheme, between data blocks in each process, a transmitting end may receive feedback information from the receiving end. Feedback information for an $i^{th}$ data block may be used by the transmitting end to encode an $(i+1)^{th}$ data block.

For example, the feedback information for the $i^{th}$ data block indicates information such as an association depth w of the $(i+1)^{th}$ data block, a quantity of encoded data packets, and the like. Alternatively, the feedback information for the $i^{th}$ data block indicates a reception status of an original data packet and an encoded data packet in the $i^{th}$ data block, for example, a quantity of incorrect original data packets, a quantity of incorrect encoded data packets, and the like. The transmitting end determines the association depth w of the $(i+1)^{th}$ data block, the quantity of encoded data packets, and the like based on information such as the quantity of incorrect original data packets and the quantity of incorrect encoded data packets.

It can be learned that, for an encoded part of each data block, coding parameters (for example, an association depth and a quantity of encoded data packets) are optimized based on feedback information of a previous data block. However, each data block is likely to be incorrect. Therefore, if an association depth is too large, a $k^{th}$ data block may time out. In this case, if data packets in the $k^{th}$ data block to a $(k+3)^{th}$ data block are all incorrect, and if an encoded data packet in a $(k+4)^{th}$ data block is related to original data packets in the $(k+1)^{th}$ data block to the $(k+3)^{th}$ data block, an original data packet in the $k^{th}$ data block may still fail to be correctly decoded due to an insufficient quantity of encoded packets.

Therefore, based on a requirement of the maximum latency, the feedback information needs to further indicate a data block that first times out. When encoding an $(i+T)^{th}$ data block, the transmitting end encodes an original data packet in the $(i+T)^{th}$ data block and the original data packet in the $i^{th}$ data block that is to time out, to obtain an encoded data packet in the $(i+T)^{th}$ data block, without introduction of another data block between the $i^{th}$ data block and the $(i+T)^{th}$ data block, to reduce impact of the another data block on decoding performance. In this way, an incorrect data packet in the $i^{th}$ data block is successfully decoded as much as possible before the $i^{th}$ data block times out.

In a possible case, the transmitting end receives feedback information that is for an $(i+T-1)^{th}$ data block and that is from the receiving end.

The feedback information indicates that the $i^{th}$ data block is incorrectly decoded, and indicates a quantity of data packets required for correctly decoding the $i^{th}$ data block. The transmitting end determines, based on the feedback information for the $(i+T-1)^{th}$ data block, whether the $i^{th}$ data block is correctly decoded. When the $i^{th}$ data block is incorrectly decoded, the transmitting end sends the $(i+T)^{th}$ data block, where the encoded data packet in the $(i+T)^{th}$ data block is obtained by encoding the original data packet in the $i^{th}$ data block and the original data packet in the $(i+T)^{th}$ data block.

In another possible case, the transmitting end receives feedback information that is for an $(i+T-1)^{th}$ data block and that is from the receiving end.

The feedback information indicates that the $i^{th}$ data block is correctly decoded, and indicates quantities of incorrect original data packets and incorrect encoded data packets in the $(i+T-1)^{th}$ data block. The quantities of incorrect original data packets and incorrect encoded data packets in the $(i+T-1)^{th}$ data block may be equivalent to an association depth and a quantity of encoded packets. The transmitting end determines, based on the feedback information, whether the $i^{th}$ data block is correctly decoded. When the $i^{th}$ data block is correctly decoded, the transmitting end determines the association depth of the $(i+T)^{th}$ data block and the quantity of encoded data packets based on the feedback information. The transmitting end sends the $(i+T)^{th}$ data block.

In the foregoing feedback-based convolutional network coding scheme, the time unit in this application is a period of the feedback information, for example, (RTT).

Figure 17:
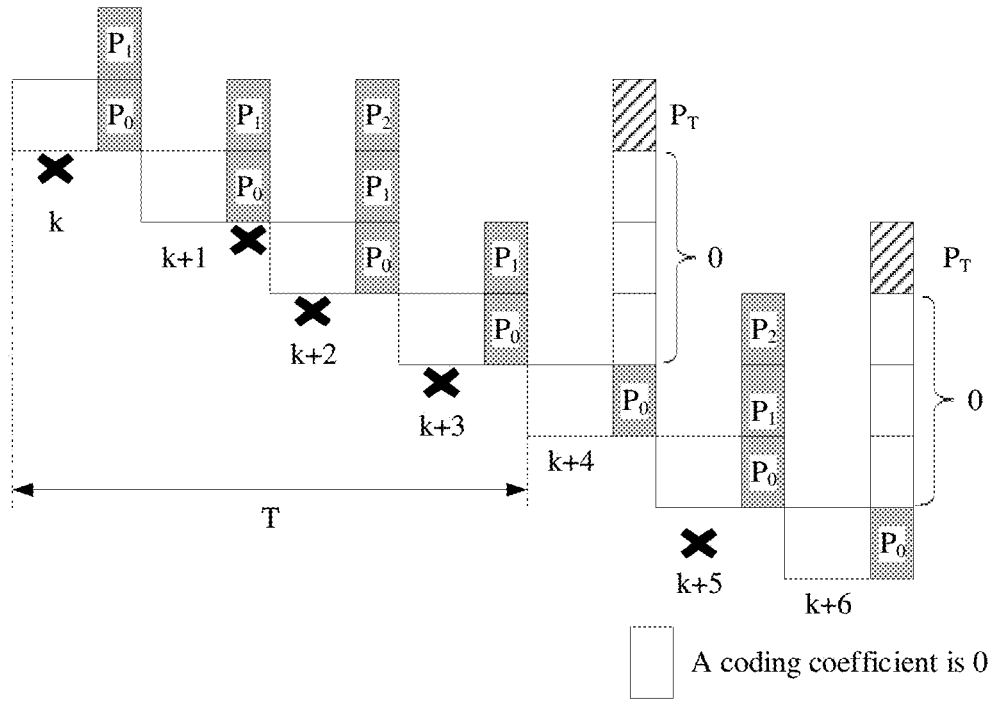
FIG. 17 is a schematic diagram of still another data sending method according to this application.

With reference to FIG. 17, the following describes a solution in which feedback is introduced.

FIG. 17 shows an example of still yet another data sending method according to this application. As shown in FIG. 17, an original data packet in a $k^{th}$ data block is incorrect. When encoding a $(k+1)^{th}$ data block, a transmitting end encodes the original data packet in the $k^{th}$ data block and an original data packet in the $(k+1)^{th}$ data block, to obtain an encoded data packet in the $(k+1)^{th}$ data block. In other words, an association depth of the $(k+1)^{th}$ data block is 2. If the encoded data packet in the $(k+1)^{th}$ data block is incorrect, in a $(k+2)^{th}$ data block, the transmitting end encodes the original data packet in the $k^{th}$ data block, the original data packet in the $(k+1)^{th}$ data block, and an original data packet in the $(k+2)^{th}$ data block, to obtain an encoded data packet in the $(k+2)^{th}$ data block. It can be learned that an association depth of the $(k+2)^{th}$ data block is 3. If the original data packet in the $(k+2)^{th}$ data block is incorrect, in a $(k+3)^{th}$ data block, the transmitting end encodes the original data packet in the $(k+2)^{th}$ data block and an original data packet in the $(k+3)^{th}$ data block, to obtain an encoded data packet in the $(k+3)^{th}$ data block. In other words, an association depth of the $(k+3)^{th}$ data block is 2. It can be found that, based on feedback from the receiving end on incorrectness and correctness of an original data packet and an encoded data packet in a data block, the transmitting end may continuously adjust a coding parameter (for example, an association depth) of a next data block during encoding, to optimize coding performance.

It is assumed that the original data packet in the $(k+3)^{th}$ data block is incorrect, the receiving end still fails to correctly recover the original data packet in the $k^{th}$ data block by using the $(k+3)^{th}$ data block, and the $k^{th}$ data block is to time out. In this case, the receiving end determines, in feedback information for the $(k+3)^{th}$ data block, content of the feedback information depending on whether the original data packet in the $k^{th}$ data block is correctly decoded. When the $k^{th}$ data block is not successfully decoded, the feedback information may include a decoding failure and timeout flag and a quantity of required encoded data packets. When the $k^{th}$ data block is successfully decoded, the feedback information may include a decoding success flag and quantities of incorrect original data packets and incorrect encoded data packets in the $(k+3)^{th}$ data block. For example, the decoding success flag or the decoding failure flag may be indicated by using 1 bit. For example, 1 indicates that decoding succeeds, and 0 indicates that decoding fails. In this way, the transmitting end encodes, in a $(k+4)^{th}$ data block based on the feedback information for the $(k+3)^{th}$ data block, only the original data packet in the $k^{th}$ data block and an original data packet in the $(k+4)^{th}$ data block, to obtain an encoded data packet in the $(k+4)^{th}$ data block. The receiving end continues to recover an incorrect data packet in the $k^{th}$ data block by using the $(k+4)^{th}$ data block, to enhance decoding.

In a possible case, if the receiving end correctly decodes the original data packet in the $k^{th}$ data block by using the $(k+4)^{th}$ data block, the receiving end may perform backward decoding by using the data packet in the $k^{th}$ data block, to attempt to recover an incorrect data packet in the $(k+1)^{th}$ data block, an incorrect data packet in the $(k+2)^{th}$ data block, and an incorrect data packet in the $(k+3)^{th}$ data block.

As shown in FIG. 17, if the original data packet in the $(k+1)^{th}$ data block is correct, but the original data packet in the $(k+2)^{th}$ data block is still incorrect, feedback information for the $(k+4)^{th}$ data block indicates a status existing after decoding is completed, for example, indicates whether there is a data block that is to time out and corresponding feedback information. In this case, a timeout problem does not need to be considered for a $(k+5)^{th}$ data block. Feedback information from the receiving end may include information indicating that decoding succeeds and there is no data block that is to time out, and information such as an association depth and a quantity of encoded packets. For the transmitting end, because the $(k+1)^{th}$ data block is correctly decoded and there is no data block that is to time out, in the $(k+5)^{th}$ data block, the transmitting end may perform encoding based on the association depth and the quantity of encoded packets that are indicated by the feedback information. Herein, the association depth is 3. For example, whether there is a data block that is to time out may be indicated by using 1 bit. For example, 1 indicates that there is a data block that is to time out, and 0 indicates that there is no data block that is to time out. However, if an original data packet in the $(k+5)^{th}$ data block is incorrectly decoded, the feedback information indicates that there is a data block that is to time out. In this way, in a $(k+6)^{th}$ data block, the transmitting end encodes the original data packet in the $(k+2)^{th}$ data block and an original data packet in the $(k+6)^{th}$ data block, to obtain an encoded data packet in the $(k+6)^{th}$ data block. The rest may be deduced by analogy. Details are not described.

The sliding window network coding scheme based on a maximum latency, the solution of combining the sliding window network coding scheme and the convolutional network coding scheme, and the feedback solution in which feedback from a receiving end is introduced on this basis are described in Solution 3, to ensure that an original data packet in a data block that is to time out is successfully recovered within the maximum latency. The solution can meet a requirement of the maximum latency. In addition, an association depth and a quantity of encoded packets of convolutional network coding can be optimized by using feedback information. This improves decoding performance, avoids overheads caused by a redundant encoded packet, and improves system performance.

The foregoing describes in detail the data sending and data receiving method provided in this application. The following describes a communication apparatus provided in this application.

Figure 18:
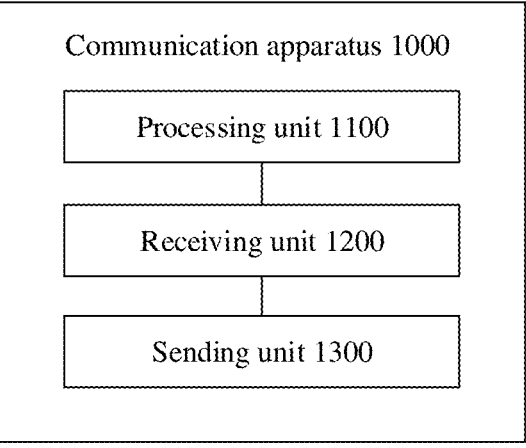
FIG. 18 is a schematic block diagram of a communication apparatus according to this application.

FIG. 18 is a schematic block diagram of a communication apparatus according to this application. As shown in FIG. 18, a communication apparatus 1000 includes a processing unit 1100, a receiving unit 1200, and a sending unit 1300.

Optionally, the communication apparatus 1000 may correspond to the transmitting end in embodiments of this application.

In some solutions, the units of the communication apparatus 1000 are configured to implement the following functions.

The receiving unit 1200 is configured to obtain T first data blocks and coding coefficients corresponding to original data packets in the T first data blocks.

An $i^{th}$ first data block in the T first data blocks includes $k_i$ original data packets, $1 \leq i \leq T$, and T, $k_i$, and i are all positive integers.

The coding coefficients satisfy the following coding coefficient matrix:

A size of the coding coefficient matrix is T rows by (T+B) columns, and an element in row i and column j in the coding coefficient matrix is represented as $a_{i,j}$, where $1 \leq i \leq T$, $1 \leq j \leq (T+B)$, j is an integer, the coding coefficient matrix is constituted by a first matrix whose size is T rows by T columns and a check matrix whose size is T rows by B columns, and the first matrix is located on a left side of the check matrix.

The first matrix includes T×T elements, each element is a matrix, T elements on a diagonal of the first matrix are all identity matrices, remaining elements are zero matrices, and the first matrix includes the element $a_{i,j}$ in the coding coefficient matrix, where i=1, 2, . . . , B, (B+1), . . . , T, j=1, 2, . . . , T, an element $a_{i,j}$ in the T elements includes $k_i \times k_j$ coding coefficients, and $1 \leq i \leq T$; the check matrix includes a first submatrix whose size is B×B and a second submatrix whose size is (T–B)×B, and the check matrix includes the element $a_{i,j}$ in the coding coefficient matrix, where i=1, 2, . . . , T, j=(T+1), (T+2), . . . , (T+B), and an element $a_{i,j}$ in the check matrix is a $k_i \times n_j$ matrix; and the first submatrix is located on an upper side of the second submatrix, the first submatrix includes elements in first B rows and last B columns in the coding coefficient matrix, and the second submatrix includes elements in last (T–B) rows and the last B columns in the coding coefficient matrix.

The first submatrix includes B×B elements, each element is a matrix, B elements on a diagonal of the first submatrix are non-zero matrices, remaining elements are zero matrices, and the first submatrix includes the element $a_{i,j}$ in the coding coefficient matrix, where i=1, 2, . . . , B, j=(T+1), (T+2), . . . , (T+B), and an element $a_{i,j}$ in the B elements includes $k_i$ rows and $n_j$ columns and includes $k_i \times n_j$ coding coefficients.

Elements in the second submatrix and elements in last (T–B) rows and last (T–B) columns in the first matrix constitute a second matrix whose size is (T–B)×B, the second matrix is a generator matrix of a system MDS code, the second submatrix is a check part of the generator matrix, the second submatrix includes (T–B) rows and B columns, and the second submatrix includes the element $a_{i,j}$ in the coding coefficient matrix, where i=(B+1), (B+2), . . . , T, j=(T+1), (T+2), . . . , (T+B), and an element $a_{i,j}$ included in the second submatrix includes $k_i \times n_j$ coding coefficients.

The processing unit 1100 is configured to encode the original data packets in the T first data blocks by using the coding coefficients and respective bit rates of first B first data blocks in the T first data blocks, to obtain (T+B) second data blocks, where first T second data blocks in the (T+B) second data blocks are the T first data blocks, last B second data blocks in the (T+B) second data blocks are B encoded data blocks, and a quantity of encoded data packets in an $i^{th}$ encoded data block in the B encoded data blocks is determined based on a quantity of original data packets in an $i^{th}$ first data block in the first B first data blocks and a bit rate of the $i^{th}$ first data block.

The sending unit 1300 is configured to send the (T+B) second data blocks.

Optionally, in an embodiment, that a quantity of encoded data packets in an $i^{th}$ encoded data block in the B encoded data blocks is related to a quantity of original data packets in an $i^{th}$ first data block in the first B first data blocks and a bit rate of the $i^{th}$ first data block includes:

$$r_i = k_i/(k_i + n_j), \text{ where } i=1, 2, . . . , B, \text{ and } j=i+T.$$

The $i^{th}$ encoded data block in the B encoded data blocks is a $j^{th}$ data block in the (T+B) second data blocks, $r_i$ represents the bit rate of the $i^{th}$ first data block in the first B first data blocks, $k_i$ represents the quantity of original data packets in the $i^{th}$ first data block in the first B first data blocks, and $n_j$ represents the quantity of encoded data packets in the $i^{th}$ encoded data block in the B encoded data blocks.

Optionally, in an embodiment, different second data blocks in the (T+B) second data blocks are transmitted in different time units, and the time unit includes one or more slots, or the time unit includes one or more symbols.

Optionally, in an embodiment, T represents a quantity of time units of a maximum latency allowed for transmitting the original data packet, and T is greater than or equal to B.

Optionally, in an embodiment, B is variable.

Optionally, in some other solutions, the units of the communication apparatus 1000 have the following functions.

The receiving unit 1200 is configured to obtain T first data blocks, T second data blocks, and coding coefficients corresponding to original data packets in the T first data blocks and original data packets in the T second data blocks.

An $i^{th}$ first data block in the T first data blocks and an $i^{th}$ second data block in the T second data blocks each include $k_i$ original data packets, versions of the original data packets included in the T first data blocks are first redundancy versions, versions of original data packets included in first B second data blocks in the T second data blocks are second redundancy versions, and versions of original data packets in last (T–B) second data blocks in the T second data blocks are the first redundancy versions.

The coding coefficients satisfy the following coding coefficient matrix:

A size of the coding coefficient matrix is T rows by (T+B) columns, the coding coefficient matrix includes a first matrix whose size is T rows by T columns and a check matrix whose size is T rows by B columns, and the first matrix is located on a left side of the check matrix.

The first matrix includes T×T elements, each element is a matrix, T elements on a diagonal of the first matrix are all identity matrices, remaining elements are zero matrices, an $i^{th}$ element in the T elements includes $k_i \times k_i$ coding coefficients, and $1 \le i \le T$.

The check matrix includes a first submatrix whose size is B×B and a second submatrix whose size is (T−B)×B.

The first submatrix includes B×B elements, B elements on a diagonal of the first submatrix are all identity matrices, and remaining elements are zero matrices; and elements in the second submatrix and elements in last (T−B) rows and last (T−B) columns in the first matrix constitute a second matrix whose size is (T−B)×B, the second matrix is a generator matrix of a system MDS code, and the second submatrix is a check part of the generator matrix.

The processing unit 1100 is configured to: encode the original data packets in the T first data blocks by using coding coefficients in the first matrix, to obtain T third data blocks; and encode the original data packets in the T second data blocks by using coding coefficients in the check matrix, to obtain B fourth data blocks.

The T third data blocks are the T first data blocks, the B fourth data blocks are B encoded data blocks, each encoded data block includes one or more encoded data packets, and a quantity of data packets in an $i^{th}$ encoded data block in the B encoded data blocks is equal to a quantity of data packets in an $i^{th}$ first data block in first B first data blocks in the T first data blocks.

The sending unit 1300 is configured to send the T third data blocks and the B fourth data blocks.

Optionally, in another embodiment, different data blocks in the T third data blocks and the B fourth data blocks are transmitted in different time units, and the time unit includes one or more slots, or the time unit includes one or more symbols.

Optionally, in another embodiment, T represents a quantity of time units of a maximum latency allowed for a data packet in the first data block, and T is greater than or equal to B.

Optionally, in another embodiment, B is variable.

Optionally, in some other solutions, the units of the communication apparatus 1000 have the following functions.

The receiving unit 1200 is configured to obtain T first data blocks, where an $i^{th}$ first data block in the T first data blocks includes $k_i$ original data packets, $1 \le i \le T$, and T, $k_i$, and i are all positive integers.

The processing unit 1100 is configured to: encode data packets in first B first data blocks in the T first data blocks, to obtain B first encoded data blocks; and encode data packets in remaining (T−B) first data blocks in the T first data blocks, to obtain B second encoded data blocks, where a quantity of encoded data packets in an $i^{th}$ first encoded data block in the B first encoded data blocks is equal to a quantity of encoded data packets in an $i^{th}$ second encoded data block in the B second encoded data blocks; and sequentially and correspondingly perform, in a finite field, an addition operation on the encoded data packets in the $i^{th}$ first encoded data block in the B first encoded data blocks and the encoded data packets in the $i^{th}$ second encoded data block in the B second encoded data blocks, to obtain B third encoded data blocks, where an $i^{th}$ third encoded data block in the B third encoded data blocks includes $n_j$ encoded data packets, $1 \le i \le B$, j=i+T, and B, i, $n_j$, and j are all positive integers.

The sending unit 1300 is configured to send the T first data blocks and the B third encoded data blocks.

Optionally, in an embodiment, a quantity of encoded data packets in the $i^{th}$ encoded data block in the B third encoded data blocks is related to a quantity $k_i$ of original data packets in an $i^{th}$ first data block in the first B first data blocks and a bit rate of the $i^{th}$ first data block.

Optionally, in another embodiment, that a quantity of encoded data packets in the $i^{th}$ encoded data block in the B third encoded data blocks is related to a quantity $k_i$ of original data packets in an $i^{th}$ first data block in the first B first data blocks and a bit rate of the $i^{th}$ first data block includes:

The quantity of encoded data packets in the $i^{th}$ encoded data block in the B encoded data blocks, the quantity $k_i$ of original data packets in the $i^{th}$ first data block in the first B first data blocks, and the bit rate of the $i^{th}$ first data block satisfy the following function relation:

$$r_i = k_i/(k_i + n_j), \text{ where } i = 1, 2, \ldots, B, \text{ and } j = i + T.$$

$r_i$ represents the bit rate of the $i^{th}$ first data block in the first B first data blocks, $k_i$ represents the quantity of original data packets in the $i^{th}$ first data block in the first B first data blocks, $n_j$ represents the quantity of encoded data packets in the $i^{th}$ encoded data block in the B encoded data blocks, and "/" represents a division operation.

Optionally, in some other solutions, the units of the communication apparatus 1000 have the following functions.

The receiving unit 1200 is configured to: obtain T first data blocks, where an $i^{th}$ first data block in the T first data blocks includes $k_i$ original data packets, and versions of original data packets included in the T first data blocks are first redundancy versions; and the processing unit 1100 is configured to: encode original data packets included in last (T−B) first data blocks in the T first data blocks, to obtain B second data blocks.

The processing unit 1100 is configured to perform, in a finite field, addition on original data packets in the B second data blocks and B third data blocks, to obtain B fourth data blocks, where the B third data blocks are first B first data blocks in the T first data blocks, versions of original data packets included in the B third data blocks are second redundancy versions of original data packets included in the first B first data blocks, and a quantity of original data packets in an $i^{th}$ third data block in the B third data blocks is equal to a quantity of data packets in an $i^{th}$ second data block in the B second data blocks.

The sending unit 1300 is configured to send the T first data blocks and the B fourth data blocks.

Optionally, in some other solutions, the units of the communication apparatus 1000 have the following functions.

The sending unit 1300 is configured to send an $(i+T)^{th}$ data block, where the $(i+T)^{th}$ data block includes an original data packet and an encoded data packet, the encoded data packet is obtained by encoding the original data packet in the $(i+T)^{th}$ data block and an original data packet in an $i^{th}$ data block, T represents a quantity of time units of a maximum latency allowed for the original data packet in the $i^{th}$ data block, and one data block is transmitted in one time unit.

Optionally, in an embodiment, that the encoded data packet is obtained by encoding the original data packet in the $(i+T)^{th}$ data block and an original data packet in an $i^{th}$ data block includes:

The encoded data packet is obtained by encoding the original data packet in the $(i+T)^{th}$ data block, the original data packet in the $i^{th}$ data block, and an original data packet or original data packets in one or more data blocks between the $i^{th}$ data block and the $(i+T)^{th}$ data block.

Optionally, in an embodiment, the receiving unit 1200 is configured to receive feedback information that is for an $(i+T-1)^{th}$ data block and that is from a receiving end, where the feedback information indicates that the $i^{th}$ data block is incorrectly decoded, and indicates a quantity of encoded data packets required for correctly decoding the $i^{th}$ data block.

The processing unit 1100 is configured to determine, based on the feedback information, that the $i^{th}$ data block is incorrectly decoded.

Optionally, in an embodiment, the receiving unit 1200 is configured to:

receive feedback information that is for an $(i+T-1)^{th}$ data block and that is from a receiving end, where the feedback information indicates that the $i^{th}$ data block is correctly decoded, and indicates quantities of incorrect original data packets and incorrect encoded data packets in the $(i+T-1)^{th}$ data block.

The processing unit 1100 is configured to:

determine, based on the feedback information, that the $i^{th}$ data block is correctly decoded; and determine an association depth w of the $(i+T)^{th}$ data block and a quantity of encoded data packets based on the feedback information.

The encoded data packet in the $(i+T)^{th}$ data block is obtained by encoding the original data packet in the $(i+T)^{th}$ data block, an original data packet in an $(i+T-w+1)^{th}$ data block, and an original data packet or original data packets in one or more data blocks between the $(i+T)^{th}$ data block and the $(i+T-w+1)^{th}$ data block.

Optionally, in the foregoing implementation in which the feedback information is introduced, the time unit of the maximum latency is a period of the feedback information.

In the foregoing implementations, the receiving unit 1200 and the sending unit 1300 may alternatively be integrated into one transceiver unit, and the transceiver unit has both a receiving function and a sending function. This is not limited herein.

In embodiments in which the communication apparatus 1000 corresponds to the transmitting end, the processing unit 1100 is configured to perform processing and/or an operation that is implemented inside the transmitting end except sending and receiving actions. The receiving unit 1200 is configured to perform the receiving action, and the sending unit 1300 is configured to perform the sending action.

For example, in FIG. 3, the receiving unit 1200 is configured to perform step 310, the processing unit 1100 is configured to perform step 320, and the sending unit 1300 is configured to perform step 330.

For another example, in FIG. 6, the receiving unit 1200 is configured to perform step 510, the processing unit 1100 is configured to perform step 520 and step 530, and the sending unit 1300 is configured to perform step 540.

For another example, in FIG. 8, the receiving unit 1200 is configured to perform step 610, the processing unit 1100 is configured to perform step 620, and the sending unit 1300 is configured to perform step 630.

For another example, in FIG. 12, the receiving unit 1200 is configured to perform step 810, the processing unit 1100 is configured to perform step 820 and step 830, and the sending unit 1300 is configured to perform step 840.

Optionally, the communication apparatus 1000 may correspond to the receiving end in embodiments of this application.

Optionally, in some solutions, the units of the communication apparatus 1000 are configured to implement the following functions.

The receiving unit 1200 is configured to receive (T+B) second data blocks, where first T second data blocks in the (T+B) second data blocks are T first data blocks, last B second data blocks in the (T+B) second data blocks are B encoded data blocks, and a quantity of encoded data packets in an $i^{th}$ encoded data block in the B encoded data blocks is related to a quantity of original data packets in an $i^{th}$ first data block in first B first data blocks and a bit rate of the $i^{th}$ first data block.

The processing unit 1100 is configured to decode correctly received data packets in the (T+B) second data blocks, to obtain all data packets included in the T first data blocks.

A quantity $W_j$ of incorrect data packets in a $j^{th}$ second data block in first B second data blocks in the received second data blocks is not greater than a quantity $M_{j+T}$ of correctly received data packets in a $(j+T)^{th}$ second data block in the received second data blocks, and a total quantity $$\sum_{1}^{T} W_j$$

of incorrect data packets in the first T second data blocks in the received second data blocks is not greater than a total quantity $$\sum_{j=T+1}^{T+B} M_j$$

of correct data packets in the last B second data blocks in the received second data blocks, where $M$, represents a quantity of correctly received data packets in a $j^{th}$ second data block in the (T+B) second data blocks.

An $i^{th}$ first data block in the T first data blocks includes $k_i$ original data packets, $1 \le i \le T$, and T, B, $k_i$, and i are all positive integers.

The data packet in the T first data blocks and the data packet in the (T+B) second data blocks satisfy the following relationship of a coding coefficient matrix:

A size of the coding coefficient matrix is T rows by (T+B) columns, and an element in row i and column j in the coding coefficient matrix is represented as $a_{i,j}$, where $1 \le i \le T$, $1 \le j \le$ (T+B), j is an integer, the coding coefficient matrix is constituted by a first matrix whose size is T rows by T columns and a check matrix whose size is T rows by B columns, and the first matrix is located on a left side of the check matrix.

The first matrix includes T×T elements, each element is a matrix, T elements on a diagonal of the first matrix are all identity matrices, remaining elements are zero matrices, and the first matrix includes the element $a_{i,j}$ in the coding coefficient matrix, where i=1, 2, . . . , B, (B+1), . . . , T, j=1, 2, . . . , T, and an element $a_{i,j}$ in the T elements includes $k_i \times k_j$ coding coefficients; the check matrix includes a first submatrix whose size is B×B and a second submatrix whose size is (T−B)×B, and the check matrix includes the element $a_{i,j}$ in the coding coefficient matrix, where i=1, 2, . . . , T, j=(T+1), (T+2), . . . , (T+B), and an element $a_{i,j}$ in the check matrix is a $k_i \times n_j$ matrix; and the first submatrix is located on an upper side of the second submatrix, the first submatrix includes elements in first B rows and last B columns in the coding coefficient matrix, and the second submatrix includes elements in last (T–B) rows and the last B columns in the coding coefficient matrix.

The first submatrix includes B×B elements, each element is a matrix, B elements on a diagonal of the first submatrix are non-zero matrices, remaining elements are zero matrices, and the first submatrix includes the element $a_{i,j}$ in the coding coefficient matrix, where i=1, 2, . . . , B, j=(T+1), (T+2), . . . , (T+B), and an element $a_{i,j}$ in the B elements includes $k_i$ rows and $n_j$ columns and includes $k_i×n_j$ coding coefficients.

Elements in the second submatrix and elements in last (T–B) rows and last (T–B) columns in the first matrix constitute a second matrix whose size is (T–B)×B, the second matrix is a generator matrix of a system maximum distance separable MDS code, the second submatrix is a check part of the generator matrix, the second submatrix includes (T–B) rows and B columns, the second submatrix includes (T–B)×B elements, and the second submatrix includes the element $a_{i,j}$ in the coding coefficient matrix, where i=(B+1), (B+2), . . . , T, j=(T+1), (T+2), . . . , (T+B), and an element $a_{i,j}$ included in the second submatrix is an element in row i and column j and includes $k_i×n_j$ coding coefficients.

Optionally, in some other solutions, the units of the communication apparatus 1000 are configured to implement the following functions.

The receiving unit 1200 is configured to receive (T+B) data blocks, where first T data blocks in the (T+B) data blocks are T third data blocks, last B data blocks in the (T+B) data blocks are B fourth data blocks, the T third data blocks are T first data blocks, the B fourth data blocks are B encoded data blocks, each encoded data block in the B encoded data blocks includes one or more encoded data packets, and a quantity of data packets in an $i^{th}$ encoded data block in the B encoded data blocks is equal to a quantity of data packets in an $i^{th}$ first data block in first B first data blocks in the T first data blocks.

The processing unit 1100 is configured to decode all or a part of data blocks in the (T+B) data blocks, to obtain all data packets included in the T first data blocks.

A relationship between the T third data blocks and the T first data blocks satisfies a first matrix in the following coding coefficient matrix, a relationship between the B fourth data blocks and T second data blocks satisfies a check matrix in the coding coefficient matrix, versions of all the data packets included in the T first data blocks are first redundancy versions of original data packets, versions of all data packets included in first B second data blocks in the T second data blocks are second redundancy versions of the original data packets, and all data packets in last (T–B) second data blocks in the T second data blocks are the first redundancy versions of the original data packets.

An $i^{th}$ first data block in the T first data blocks and an $i^{th}$ second data block in the T second data blocks each include $k_i$ original data packets, 1≤i≤T, and T, B, $k_i$, and i are all positive integers.

A size of the coding coefficient matrix is T rows by (T+B) columns, the coding coefficient matrix includes the first matrix whose size is T rows by T columns and the check matrix whose size is T rows by B columns, and the first matrix is located on a left side of the check matrix.

The first matrix includes T×T elements, each element is a matrix, T elements on a diagonal of the first matrix are all identity matrices, remaining elements are zero matrices, an $i^{th}$ element in the T elements includes $k_i×k_i$ coding coefficients, and 1≤i≤T.

The check matrix includes a first submatrix whose size is B×B and a second submatrix whose size is (T–B)×B.

The first submatrix includes B×B elements, B elements on a diagonal of the first submatrix are all identity matrices, and remaining elements are zero matrices; and elements in the second submatrix and elements in last (T–B) rows and last (T–B) columns in the first matrix constitute a second matrix whose size is (T–B)×B, the second matrix is a generator matrix of a system maximum distance separable MDS code, and the second submatrix is a check part of the generator matrix.

Optionally, in another embodiment, the processing unit 1100 is configured to:
   determine a quantity Q and positions of incorrect data blocks in the (T+B) data blocks, where Q is a non-negative integer; and
   decode all or some of data blocks in the (T+B) data blocks based on the quantity Q and positions of incorrect data blocks, to obtain all the data packets included in the T first data blocks.

The sending unit 1300 is configured to output all the data packets included in the T first data blocks.

Optionally, in another embodiment, the processing unit 1100 is configured to:
   if Q is greater than B, and the Q incorrect data blocks are any Q data blocks in the B data blocks in a first data block set and the B fourth data blocks, decode the B fourth data blocks and data blocks that are included in the first data block set; or
   if Q is greater than B, and one or more incorrect data blocks in the Q incorrect data blocks are B data blocks included in a second data block set, skip performing decoding.

First B third data blocks in the T third data blocks constitute the first data block set, and last (T–B) third data blocks in the first T third data blocks constitute the second data block set.

Optionally, in another embodiment, the processing unit 1100 is configured to:
   obtain different redundancy versions of data packets in all or the part of data blocks in the (T+B) data blocks; and
   recover incorrect data packets in the Q incorrect data blocks by using the different redundancy versions of the data packets in all or the part of data blocks.

Optionally, in another embodiment, the processing unit 1100 is configured to:
   if Q is less than or equal to B, and the Q incorrect data blocks are any Q data blocks in B contiguous data blocks in the (T+B) data blocks, decode correct data blocks in the (T+B) data blocks.

Optionally, in another embodiment, the processing unit 1100 is configured to:
   if Q is less than or equal to B, and the Q incorrect data blocks are any Q data blocks in the (T+B) data blocks, decode all the data blocks in the (T+B) data blocks.

Optionally, in another embodiment, different data blocks in the (T+B) data blocks are transmitted in different time units, and the time unit includes one or more slots, or the time unit includes one or more symbols.

Optionally, in another embodiment, T represents a quantity of time units of a maximum latency allowed for a data packet in the first data block, and T is greater than or equal to B.

Optionally, in some other solutions, the units of the communication apparatus 1000 are configured to implement the following functions.

The receiving unit 1200 is configured to receive an $(i+T)^{th}$ data block, where the $(i+T)^{th}$ data block includes an original data packet and an encoded data packet, the encoded data packet and a first data packet set satisfy a coding relationship, the first data packet set includes the original data packet in the $(i+T)^{th}$ data block and an original data packet in an $i^{th}$ data block, T represents a quantity of time units of a maximum latency allowed for the original data packet in the $i^{th}$ data block, and one data block is transmitted in one time unit.

The processing unit 1100 is configured to perform decoding based on the $(i+T)^{th}$ data block in combination with the $i^{th}$ data block, to recover the original data packet in the $i^{th}$ data block, or recover the original data packet in the $i^{th}$ data block and the original data packet in the $(i+T)^{th}$ data block.

Optionally, in another embodiment, that the encoded data packet is obtained by encoding the original data packet in the $(i+T)^{th}$ data block and an original data packet in an $i^{th}$ data block includes:

The encoded data packet is obtained by encoding the original data packet in the $(i+T)^{th}$ data block, the original data packet in the $i^{th}$ data block, and an original data packet or original data packets in one or more data blocks between the $i^{th}$ data block and the $(i+T)^{th}$ data block.

Optionally, in another embodiment, the processing unit 1100 is configured to determine that the the $i^{th}$ data block is incorrectly decoded.

The sending unit 1300 is configured to send feedback information for an $(i+T-1)^{th}$ data block, where the feedback information indicates that the $i^{th}$ data block is incorrectly decoded, and indicates a quantity of encoded data packets required for correctly decoding the $i^{th}$ data block.

Optionally, in another embodiment, the processing unit 1100 is configured to determine that the $i^{th}$ data block is correctly decoded.

The sending unit 1300 is further configured to send feedback information for an $(i+T-1)^{th}$ data block, where the feedback information indicates that the $i^{th}$ data block is correctly decoded, and indicates quantities of incorrect original data packets and incorrect encoded data packets in the $(i+T-1)^{th}$ data block.

In the foregoing implementations, the receiving unit 1200 and the sending unit 1300 may alternatively be integrated into one transceiver unit, and the transceiver unit has both a receiving function and a sending function. This is not limited herein.

In embodiments in which the communication apparatus 1000 corresponds to the receiving end, the processing unit 1100 is configured to perform processing and/or an operation that is implemented inside the receiving end except sending and receiving actions. The receiving unit 1200 is configured to perform the receiving action, the sending unit 1300 is configured to perform the sending action, and sending unit 1300 is optional.

For example, in FIG. 3, the receiving unit 1200 is configured to perform the action of receiving (T+B) second data blocks in step 330, and the processing unit 1100 is configured to perform step 340.

For another example, in FIG. 8, the receiving unit 1200 is configured to perform the action of receiving (T+B) data blocks in step 630, and the processing unit 1100 is configured to perform step 640. The sending unit 1300 is configured to output a decoding result. The sending unit 1300 is optional.

For another example, in FIG. 14, the receiving unit 1200 is configured to perform step 910, and the processing unit 1100 is configured to perform step 920. The sending unit 1300 is configured to output a decoding result. The sending unit 1300 is optional.

Figure 19:
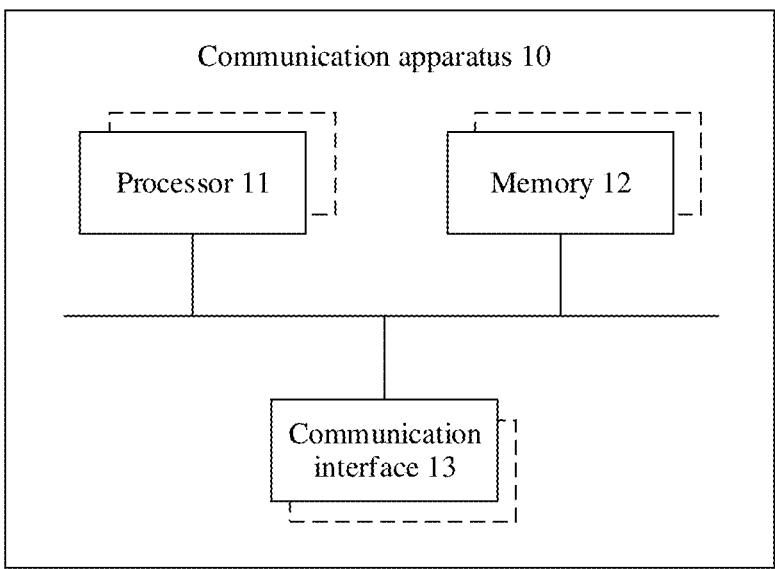
FIG. 19 is a schematic diagram of a structure of a communication apparatus according to this application.

FIG. 19 is a schematic diagram of a structure of a communication apparatus according to this application. As shown in FIG. 19, a communication apparatus 10 includes one or more processors 11, one or more memories 12, and one or more communication interfaces 13. The processor 11 is configured to control the communication interface 13 to receive and send a signal. The memory 12 is configured to store a computer program. The processor 11 is configured to: invoke the computer program from the memory 12 and run the computer program, so that the communication apparatus 10 performs processing performed by the transmitting end or the receiving end in the method embodiments of this application.

For example, the processor 11 may have a function of the processing unit 1100 shown in FIG. 18, and the communication interface 13 may have a function/functions of the receiving unit 1200 and/or the sending unit 1300 shown in FIG. 18. In some embodiments, the processor 11 may be configured to perform processing or an operation performed inside the communication apparatus, and the communication interface 13 is configured to perform a sending operation and/or a receiving operation performed by the communication apparatus.

In an implementation, the communication apparatus 10 may be the transmitting end in the method embodiments. In this implementation, the communication interface 13 may be a transceiver. The transceiver may include a receiver and/or a transmitter. Optionally, the processor 11 may be a baseband apparatus, and the communication interface 13 may be a radio frequency apparatus.

In another implementation, the communication apparatus 10 may be a chip (or a chip system) installed in the transmitting end. In this implementation, the communication interface 13 may be an interface circuit or an input/output interface.

In an implementation, the communication apparatus 10 may be the receiving end in the method embodiments. In this implementation, the communication interface 13 may be a transceiver. The transceiver may include a receiver and/or a transmitter. Optionally, the processor 11 may be a baseband apparatus, and the communication interface 13 may be a radio frequency apparatus.

In another implementation, the communication apparatus 10 may be a chip (or a chip system) installed in the receiving end. In this implementation, the communication interface 13 may be an interface circuit or an input/output interface.

In FIG. 19, a dashed box behind a component (for example, the processor, the memory, or the communication interface) indicates that there may be more than one such component.

Optionally, the memory and the processor in the foregoing apparatus embodiments may be physically independent units, or the memory may be integrated into the processor. This is not limited in this specification.

In addition, this application further provides a computer-readable storage medium. The computer-readable storage medium stores computer instructions. When the computer instructions are run on a computer, operations and/or processing performed by the transmitting end in the method embodiments of this application are/is performed.

This application further provides a computer-readable storage medium. The computer-readable storage medium stores computer instructions. When the computer instructions are run on a computer, operations and/or processing performed by the receiving end in the method embodiments of this application are/is performed.

In addition, this application further provides a computer program product. The computer program product includes computer program code or instructions. When the computer program code or the instructions is/are run on a computer, operations and/or processing performed by the transmitting end in the method embodiments of this application are/is performed.

This application further provides a computer program product. The computer program product includes computer program code or instructions. When the computer program code or the instructions is/are run on a computer, operations and/or processing performed by the receiving end in the method embodiments of this application are/is performed.

In addition, this application further provides a chip. The chip includes a processor. A memory configured to store a computer program is disposed independent of the chip. The processor is configured to execute the computer program stored in the memory, so that a transmitting end in which the chip is installed performs operations and/or processing performed by the transmitting end in any method embodiment.

Further, the chip may include a communication interface. The communication interface may be an input/output interface, an interface circuit, or the like. Further, the chip may include the memory.

This application further provides a chip. The chip includes a processor. A memory configured to store a computer program is disposed independent of the chip. The processor is configured to execute the computer program stored in the memory, so that a receiving end in which the chip is installed performs operations and/or processing performed by the receiving end in any method embodiment.

Further, the chip may include a communication interface. The communication interface may be an input/output interface, an interface circuit, or the like. Further, the chip may include the memory.

Optionally, there may be one or more processors, there may be one or more memories, and there may be one or more memories.

In addition, this application further provides a communication apparatus (for example, which may be a chip or a chip system), including a processor and a communication interface. The communication interface is configured to: receive (or referred to as input) data and/or information, and transmit the received data and/or information to the processor, the processor processes the data and/or information, and the communication interface is further configured to send (or referred to as output) data and/or information processed by the processor, so that operations and/or processing performed by the transmitting end in any method embodiment are/is performed.

This application further provides a communication apparatus (for example, which may be a chip or a chip system), including a processor and a communication interface. The communication interface is configured to: receive (or referred to as input) data and/or information, and transmit the received data and/or information to the processor, the processor processes the data and/or information, and the communication interface is further configured to send (or referred to as output) data and/or information processed by the processor, so that operations and/or processing performed by the receiving end in any method embodiment are/is performed.

In addition, this application further provides a communication apparatus, including at least one processor. The at least one processor is coupled to at least one memory, and the at least one processor is configured to execute a computer program or instructions stored in the at least one memory, so that the communication apparatus performs operations and/or processing performed by the transmitting end in any method embodiment.

This application further provides a communication apparatus, including at least one processor. The at least one processor is coupled to at least one memory, and the at least one processor is configured to execute a computer program or instructions stored in the at least one memory, so that the communication apparatus performs operations and/or processing performed by the receiving end in any method embodiment.

In addition, this application further provides a communication device, including a processor and a memory. Optionally, a transceiver may be further included. The memory is configured to store a computer program. The processor is configured to: invoke and run the computer program stored in the memory, and control the transceiver to receive and send a signal, so that the communication device performs operations and/or processing performed by the transmitting end in any method embodiment.

This application further provides a communication device, including a processor and a memory. Optionally, a transceiver may be further included. The memory is configured to store a computer program. The processor is configured to: invoke and run the computer program stored in the memory, and control the transceiver to receive and send a signal, so that the communication device performs operations and/or processing performed by the receiving end in any method embodiment.

The memory in embodiments of this application may be a volatile memory or a nonvolatile memory, or may include both a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), and is used as an external cache. Through examples but not limitative descriptions, RAMs in many forms are available, such as a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DRRAM). It should be noted that the memory of the system and methods described in this specification includes but is not limited to these memories and any memory of another proper type.

The methods provided in the foregoing embodiments may be all or partially implemented by software, hardware, firmware, or any combination thereof. When software is used to implement the embodiments, all or a part of the embodiments may be implemented in a form of a computer program product. The computer program product may include one or more computer instructions. When the computer program instructions are loaded and executed on a computer, the procedure or functions according to embodiments of this application are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a server or a data center, integrating one or more usable media.

To clearly describe the technical solutions in embodiments of this application, numbers such as "first" and "second" are used in embodiments of this application to distinguish between same items or similar items that have basically same functions or purposes. For example, a first TB and a second TB are merely intended to distinguish between different TBs, but not to limit a sequential order thereof. A person skilled in the art may understand that the numbers such as "first" and "second" do not limit a quantity or an execution sequence, and the words such as "first" and "second" do not indicate a definite difference, either.

In embodiments of this application, "at least one" means one or more, and "a plurality of" means two or more. "And/or" describes an association relationship between associated objects and represents that three relationships may exist. For example, A and/or B may represent the following cases: Only A exists, both A and B exist, and only B exists, where A and B may be singular or plural. The character "/" usually indicates an "or" relationship between the associated objects. "At least one of the following items (pieces)" or a similar expression thereof indicates any combination of these items, including a single item (piece) or any combination of a plurality of items (pieces). For example, at least one item (piece) of a, b, or c may indicate a, b, c, a and b, a and c, b and c, or a, b, and c, a, b, and c each may be singular or plural.

A person of ordinary skill in the art may be aware that, in combination with the examples described in embodiments disclosed in this specification, units and algorithm steps can be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in other manners. For example, the foregoing described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected based on actual requirements to achieve the objectives of the solutions of embodiments.

In addition, functional units in embodiments of this application may be integrated into one processing unit, each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of this application essentially, or the part contributing to the conventional technology, or a part of the technical solutions may be implemented in a form of a software product. The computer software product is stored in a storage medium, and includes several instructions for instructing a computer device (which may be a personal computer, a server, a network device, or the like) to perform all or a part of the steps of the method described in embodiments of this application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method, comprising:

obtaining T first data blocks and coding coefficients corresponding to original data packets in the T first data blocks;

encoding the original data packets in the T first data blocks by using the coding coefficients and respective bit rates of first B first data blocks in the T first data blocks, to obtain (T+B) second data blocks, wherein first T second data blocks in the (T+B) second data blocks are the T first data blocks, last B second data blocks in the (T+B) second data blocks are B encoded data blocks, and a quantity of encoded data packets in an $i^{th}$ encoded data block in the B encoded data blocks is related to a quantity of original data packets in an $i^{th}$ first data block in the first B first data blocks and a bit rate of the $i^{th}$ first data block; and sending the (T+B) second data blocks, wherein the $i^{th}$ first data block in the T first data blocks comprises $k_i$ original data packets, $1 \leq i \leq T$, and T, B, $k_i$, and i are all positive integers;

the coding coefficients satisfy the following coding coefficient matrix:

a size of the coding coefficient matrix is T rows by (T+B) columns, and an element in row i and column j in the coding coefficient matrix is represented as $a_{i,j}$, wherein $1 \leq i \leq T$, $1 \leq j \leq (T+B)$, j is an integer, the coding coefficient matrix is constituted by a first matrix having T rows by T columns and a check matrix having T rows by B columns, and the first matrix is located on a left side of the check matrix;

the first matrix comprises T×T elements, each element is a matrix, T elements on a diagonal of the first matrix are all identity matrices, remaining elements are zero matrices, and the first matrix comprises the element $a_{i,j}$ in the coding coefficient matrix, wherein i=1, 2, . . . , B, (B+1), . . . , T, j=1, 2, . . . , T, and an element $a_{i,j}$ in the T elements comprises $k_i \times k_j$ coding coefficients; the check matrix comprises a first submatrix having a size that is B×B and a second submatrix having a size that is (T−B)×B, and the check matrix comprises the element $a_{i,j}$ in the coding coefficient matrix, wherein i=1, 2, . . . , T, j=(T+1), (T+2), . . . , (T+B), and an element $a_{i,j}$ in the check matrix is a $k_i \times n_j$ matrix; and the first submatrix is located on an upper side of the second submatrix, the first submatrix comprises elements in first B rows and last B columns in the coding coefficient matrix, and the second submatrix comprises elements in last (T−B) rows and the last B columns in the coding coefficient matrix;

the first submatrix comprises B×B elements, each element is a matrix, B elements on a diagonal of the first submatrix are non-zero matrices, remaining elements are zero matrices, and the first submatrix comprises the element $a_{i,j}$ in the coding coefficient matrix, wherein i=1, 2, . . . , B, j=(T+1), (T+2), . . . , (T+B), and an element $a_{i,j}$ in the B elements comprises $k_i$ rows and $n_j$ columns and comprises $k_i \times n_j$ coding coefficients; and elements in the second submatrix and elements in last (T−B) rows and last (T−B) columns in the first matrix constitute a second matrix having a size that is (T−B)×B, the second matrix is a generator matrix of a system maximum distance separable code, the second submatrix is a check part of the generator matrix, the second submatrix comprises (T−B) rows and B columns, and the second submatrix comprises the element $a_{i,j}$ in the coding coefficient matrix, wherein i=(B+1), (B+2), . . . , T, j=(T+1), (T+2), . . . , (T+B), and an element $a_{i,j}$ comprised in the second submatrix comprises $k_i \times n_j$ coding coefficients.

2. The method according to claim 1, wherein the quantity of encoded data packets in the $i^{th}$ encoded data block in the B encoded data blocks, the quantity of original data packets in the $i^{th}$ first data block in the first B first data blocks, and the bit rate of the $i^{th}$ first data block satisfy the following function relation:

$r_i = k_i/(k_i + n_j)$, wherein i=1,2, . . . ,B, and j=i+T; and the $i^{th}$ encoded data block in the B encoded data blocks is a $j^{th}$ data block in the (T+B) second data blocks, $r_i$ represents the bit rate of the $i^{th}$ first data block in the first B first data blocks, $k_i$ represents the quantity of original data packets in the $i^{th}$ first data block in the first B first data blocks, $n_j$ represents the quantity of encoded data packets in the $i^{th}$ encoded data block in the B encoded data blocks, and "/" represents a division operation.

3. The method according to claim 1, wherein different second data blocks in the (T+B) second data blocks are transmitted in different time units, and the time unit comprises one or more slots.

4. The method according to claim 1, wherein T represents a quantity of time units of a maximum latency allowed for transmitting the original data packet, and T is greater than or equal to B.

5. The method according to claim 1, wherein B is variable.

6. The method according to claim 1, wherein different second data blocks in the (T+B) second data blocks are transmitted in different time units, and the time unit comprises one or more symbols.

7. A method, comprising:

receiving (T+B) second data blocks, wherein first T second data blocks in the (T+B) second data blocks are T first data blocks, last B second data blocks in the (T+B) second data blocks are B encoded data blocks, and a quantity of encoded data packets in an $i^{th}$ encoded data block in the B encoded data blocks is related to a quantity of original data packets in an $i^{th}$ first data block in first B first data blocks and a bit rate of the $i^{th}$ first data block; and decoding correctly received data packets in the (T+B) second data blocks, to obtain all data packets comprised in the T first data blocks, wherein a quantity $W_j$ of incorrect data packets in a $j^{th}$ second data block in first B second data blocks in the received second data blocks is not greater than a quantity $M_{j+T}$ of correctly received data packets in a $(j+T)^{th}$ second data block in the received second data blocks, and a total quantity $$\sum_{1}^{T} W_j$$

of incorrect data packets in the first T second data blocks in the received second data blocks is not greater than a total quantity $$\sum_{j=T+1}^{T+B} M_j$$

of correct data packets in the last B second data blocks in the received second data blocks, wherein $M_j$ represents a quantity of correctly received data packets in a $j^{th}$ second data block in the (T+B) second data blocks;

an $i^{th}$ first data block in the T first data blocks comprises $k_i$ original data packets, 1≤i≤T, and T, B, $k_i$, and i are all positive integers;

the data packet in the T first data blocks and the data packet in the (T+B) second data blocks satisfy the following relationship of a coding coefficient matrix:

a size of the coding coefficient matrix is T rows by (T+B) columns, and an element in row i and column j in the coding coefficient matrix is represented as $a_{i,j}$, wherein 1≤i≤T, 1≤j≤(T+B), j is an integer, the coding coefficient matrix is constituted by a first matrix having T rows by T columns and a check matrix having T rows by B columns, and the first matrix is located on a left side of the check matrix;

the first matrix comprises T×T elements, each element is a matrix, T elements on a diagonal of the first matrix are all identity matrices, remaining elements are zero matrices, and the first matrix comprises the element $a_{i,j}$ in the coding coefficient matrix, wherein i=1, 2, . . . , B, (B+1), . . . , T, j=1, 2, . . . , T, and an element $a_{i,j}$ in the T elements comprises $k_i \times k_j$ coding coefficients; the check matrix comprises a first submatrix having a size that is B×B and a second submatrix having a size that is (T−B)×B, and the check matrix comprises the element $a_{i,j}$ in the coding coefficient matrix, wherein i=1, 2, . . . , T, j=(T+1), (T+2), . . . , (T+B), and an element $a_{i,j}$ in the check matrix is a $k_i×n_j$ matrix; and the first submatrix is located on an upper side of the second submatrix, the first submatrix comprises elements in first B rows and last B columns in the coding coefficient matrix, and the second submatrix comprises elements in last (T−B) rows and the last B columns in the coding coefficient matrix;

the first submatrix comprises B×B elements, each element is a matrix, B elements on a diagonal of the first submatrix are non-zero matrices, remaining elements are zero matrices, and the first submatrix comprises the element $a_{i,j}$ in the coding coefficient matrix, wherein i=1, 2, . . . , B, j=(T+1), (T+2), . . . , (T+B), and an element $a_{i,j}$ in the B elements comprises $k_i$ rows and $n_j$ columns and comprises $k_i×n_j$ coding coefficients; and elements in the second submatrix and elements in last (T−B) rows and last (T−B) columns in the first matrix constitute a second matrix having a size that is (T−B)×B, the second matrix is a generator matrix of a system maximum distance separable code, the second submatrix is a check part of the generator matrix, the second submatrix comprises (T−B) rows and B columns, the second submatrix comprises (T−B)×B elements, and the second submatrix comprises the element $a_{i,j}$ in the coding coefficient matrix, wherein i=(B+1), (B+2), . . . , T, j=(T+1), (T+2), . . . , (T+B), and an element $a_{i,j}$ comprised in the second submatrix is an element in row i and column j and comprises $k_i×n_j$ coding coefficients.

8. A method, comprising:

obtaining T first data blocks, T second data blocks, and coding coefficients corresponding to original data packets in the T first data blocks and original data packets in the T second data blocks, wherein an $i^{th}$ first data block in the T first data blocks and an $i^{th}$ second data block in the T second data blocks each comprise $k_i$ original data packets, versions of the original data packets comprised in the T first data blocks are first redundancy versions, versions of original data packets comprised in first B second data blocks in the T second data blocks are second redundancy versions, and versions of original data packets in last (T−B) second data blocks in the T second data blocks are the first redundancy versions;

the coding coefficients satisfy the following coding coefficient matrix:

a size of the coding coefficient matrix is T rows by (T+B) columns, the coding coefficient matrix comprises a first matrix having T rows by T columns and a check matrix having T rows by B columns, and the first matrix is located on a left side of the check matrix;

the first matrix comprises T×T elements, each element is a matrix, T elements on a diagonal of the first matrix are all identity matrices, remaining elements are zero matrices, an $i^{th}$ element in the T elements comprises $k_i×k_i$ coding coefficients, and $1 \le i \le T$;

the check matrix comprises a first submatrix having a size that is B×B and a second submatrix having a size that is (T−B)×B; and the first submatrix comprises B×B elements, B elements on a diagonal of the first submatrix are all identity matrices, and remaining elements are zero matrices; and elements in the second submatrix and elements in last (T−B) rows and last (T−B) columns in the first matrix constitute a second matrix having a size that is (T−B)×B, the second matrix is a generator matrix of a system maximum distance separable MDS code, and the second submatrix is a check part of the generator matrix;

encoding the original data packets in the T first data blocks by using coding coefficients in the first matrix, to obtain T third data blocks;

encoding the original data packets in the T second data blocks by using coding coefficients in the check matrix, to obtain B fourth data blocks, wherein the T third data blocks are the T first data blocks, the B fourth data blocks are B encoded data blocks, each encoded data block comprises one or more encoded data packets, and a quantity of data packets in an $i^{th}$ encoded data block in the B encoded data blocks is equal to a quantity of data packets in an $i^{th}$ first data block in first B first data blocks in the T first data blocks; and sending the T third data blocks and the B fourth data blocks.

9. The method according to claim 8, wherein different data blocks in the T third data blocks and the B fourth data blocks are transmitted in different time units, and the time unit comprises one or more slots.

10. The method according to claim 8, wherein T represents a quantity of time units of a maximum latency allowed for transmitting the original data packets in the T first data blocks, and T is greater than or equal to B.

11. The method according to claim 8, wherein B is variable.

12. The method according to claim 8, wherein different data blocks in the T third data blocks and the B fourth data blocks are transmitted in different time units, and the time unit comprises one or more symbols.

13. A method, comprising:

receiving (T+B) data blocks, wherein first T data blocks in the (T+B) data blocks are T third data blocks, last B data blocks in the (T+B) data blocks are B fourth data blocks, the T third data blocks correspond to T first data blocks, the B fourth data blocks are B encoded data blocks, each encoded data block in the B encoded data blocks comprises one or more encoded data packets, and a quantity of data packets in an $i^{th}$ encoded data block in the B encoded data blocks is equal to a quantity of data packets in an $i^{th}$ first data block in first B first data blocks in the T first data blocks; and decoding all or a part of data blocks in the (T+B) data blocks, to obtain all data packets comprised in the T first data blocks, wherein a relationship between the T third data blocks and the T first data blocks satisfies a first matrix in the following coding coefficient matrix, a relationship between the B fourth data blocks and T second data blocks satisfies a check matrix in the coding coefficient matrix, versions of all the data packets comprised in the T first data blocks are first redundancy versions of original data packets, versions of all data packets comprised in first B second data blocks in the T second data blocks are second redundancy versions of the original data packets, and all data packets in last (T−B) second data blocks in the T second data blocks are the first redundancy versions of the original data packets;

an $i^{th}$ first data block in the T first data blocks and an $i^{th}$ second data block in the T second data blocks each comprise $k_i$ original data packets, 1≤i≤T, and T, B, $k_i$, and i are all positive integers;

a size of the coding coefficient matrix is T rows by (T+B) columns, the coding coefficient matrix comprises the first matrix having T rows by T columns and the check matrix having T rows by B columns, and the first matrix is located on a left side of the check matrix;

the first matrix comprises T×T elements, each element is a matrix, T elements on a diagonal of the first matrix are all identity matrices, remaining elements are zero matrices, an $i^{th}$ element in the T elements comprises $k_i×k_i$ coding coefficients, and 1≤i≤T;

the check matrix comprises a first submatrix having a size that is B×B and a second submatrix having a size that is (T−B)×B; and the first submatrix comprises B×B elements, B elements on a diagonal of the first submatrix are all identity matrices, and remaining elements are zero matrices; and elements in the second submatrix and elements in last (T−B) rows and last (T−B) columns in the first matrix constitute a second matrix having a size that is (T−B)×B, the second matrix is a generator matrix of a system maximum distance separable code, and the second submatrix is a check part of the generator matrix.

14. The method according to claim 13, wherein the decoding all or a part of data blocks in the (T+B) data blocks, to obtain all data packets comprised in the T first data blocks comprises:

determining a quantity Q and positions of incorrect data blocks in the (T+B) data blocks, wherein Q is a nonnegative integer; and decoding all or the part of data blocks in the (T+B) data blocks based on the quantity Q and positions of incorrect data blocks, to obtain all the data packets comprised in the T first data blocks.

15. The method according to claim 14, wherein in response to Q being greater than B, and the Q incorrect data blocks being any Q data blocks in a first data block set and the B fourth data blocks, decoding the B fourth data blocks and data blocks that are comprised in the first data block set; and in response to Q being greater than B, and one or more incorrect data blocks in the Q incorrect data blocks being B data blocks comprised in the second data block set, refraining from performing decoding, wherein first B third data blocks in the T third data blocks constitute the first data block set, and last (T−B) third data blocks in the first T third data blocks constitute the second data block set.

16. The method according to claim 14, wherein in response to Q being less than or equal to B, and the Q incorrect data blocks being any Q data blocks in B contiguous data blocks in the (T+B) data blocks, decoding correct data blocks in the (T+B) data blocks.

17. The method according to claim 14, wherein in response to Q being less than or equal to B, and the Q incorrect data blocks being any Q data blocks in the (T+B) data blocks, decoding all the data blocks in the (T+B) data blocks.

18. The method according to claim 13, wherein the decoding all or a part of data blocks in the (T+B) data blocks comprises:

obtaining different redundancy versions of data packets in all or the part of data blocks in the (T+B) data blocks; and recovering incorrect data packets in the Q incorrect data blocks by using the different redundancy versions of the data packets in all or the part of data blocks.

19. The method according to claim 13, wherein different data blocks in the (T+B) data blocks are transmitted in different time units, and the time unit comprises one or more slots, or the time unit comprises one or more symbols.

20. The method according to claim 13, wherein T represents a quantity of time units of a maximum latency allowed for a data packet in the first data block, and T is greater than or equal to B.

* * * * *